(12) United States Patent
Turner et al.

(10) Patent No.: US 10,693,464 B2
(45) Date of Patent: Jun. 23, 2020

(54) CONFIGURABLE LINEAR ACCELERATOR

(71) Applicant: Varex Imaging Corporation, Salt Lake City, UT (US)

(72) Inventors: John C Turner, Las Vegas, NV (US); Lawrence Miller, Las Vegas, NV (US); Nathan Hanson, Henderson, NV (US)

(73) Assignee: Varex Imaging Corporation, Salt Lake City, UT (US)

( * ) Notice: Subject to any disclaimer, the term of this patent is extended or adjusted under 35 U.S.C. 154(b) by 0 days.

(21) Appl. No.: 16/147,488

(22) Filed: Sep. 28, 2018

(65) Prior Publication Data
US 2019/0357343 A1    Nov. 21, 2019

Related U.S. Application Data

(60) Provisional application No. 62/673,833, filed on May 18, 2018.

(51) Int. Cl.
| | |
|---|---|
| *H05H 7/02* | (2006.01) |
| *H05H 9/00* | (2006.01) |
| *H03K 19/173* | (2006.01) |
| *H03K 5/01* | (2006.01) |
| *H03K 3/027* | (2006.01) |
| *H03K 5/00* | (2006.01) |

(Continued)

(52) U.S. Cl.
CPC ........ *H03K 19/1733* (2013.01); *H01J 29/525* (2013.01); *H01J 35/025* (2013.01); *H03K 3/027* (2013.01); *H03K 3/78* (2013.01); *H03K 5/00006* (2013.01); *H03K 5/01* (2013.01); *H05H 7/02* (2013.01); *H05H 7/22* (2013.01); *H05H 9/00* (2013.01); *H05H 9/04* (2013.01); *H05H 9/047* (2013.01); *H05H 13/04* (2013.01); *H05G 2/00* (2013.01); *H05H 2007/022* (2013.01); *H05H 2007/025* (2013.01)

(58) Field of Classification Search
CPC ............... H05H 7/02; H05H 2007/022; H05H 2007/025; H05H 9/00; H05H 9/05; H05H 9/02; H05H 9/04
See application file for complete search history.

(56) References Cited

U.S. PATENT DOCUMENTS

| | | |
|---|---|---|
| 3,965,434 A | 6/1976 | Helgesson |
| 4,163,901 A | 8/1979 | Azam |

(Continued)

OTHER PUBLICATIONS

U.S. Appl. No. 16/147,509, Notice of Allowance dated Mar. 18, 2019.

(Continued)

*Primary Examiner* — Thai Pham
(74) *Attorney, Agent, or Firm* — Laurence & Phillips IP Law

(57) ABSTRACT

Some embodiments include a system comprising: a particle power source configured to generate a particle power signal; a radio frequency (RF) power source configured to generate an RF power signal; a particle source configured to generate a particle beam in response to the particle power signal; a RF source configured to generate an RF signal in response to the RF power signal; and an accelerator structure configured to accelerate the particle beam in response to the RF signal; wherein a timing of the RF power signal is different from a timing of the particle power signal.

19 Claims, 17 Drawing Sheets

(51) Int. Cl.
*H05H 9/04* (2006.01)
*H05H 7/22* (2006.01)
*H05H 13/04* (2006.01)
*H01J 35/02* (2006.01)
*H03K 3/78* (2006.01)
*H01J 29/52* (2006.01)
*H05G 2/00* (2006.01)

(56) References Cited

U.S. PATENT DOCUMENTS

| | | |
|---|---|---|
| 4,342,060 A | 7/1982 | Gibson |
| 8,311,187 B2 | 11/2012 | Treas |
| 8,803,453 B2 | 8/2014 | Eaton |
| 8,942,351 B2 | 1/2015 | Cheung |
| 9,030,134 B2 | 5/2015 | Whittum |
| 9,119,281 B2 | 8/2015 | Chen |
| 9,258,876 B2 | 2/2016 | Cheung |
| 9,386,683 B2 | 7/2016 | Kakutani |
| 9,426,876 B2 | 8/2016 | Treas |
| 9,750,123 B1 | 8/2017 | Heath |
| 9,854,661 B2 | 12/2017 | Chen |
| 9,854,662 B2 | 12/2017 | Mishin |
| 9,867,272 B2 | 1/2018 | Lal |
| 10,015,874 B2 | 7/2018 | Mishin |
| 2010/0002843 A1 | 1/2010 | Liu et al. |
| 2010/0038563 A1 | 2/2010 | Chen |
| 2012/0081042 A1 | 4/2012 | Cheung |
| 2012/0257719 A1 | 10/2012 | Langeveld |
| 2012/0326636 A1* | 12/2012 | Eaton ............ H05H 7/02 315/501 |
| 2014/0152197 A1* | 6/2014 | Chen ............ H05H 7/02 315/501 |
| 2014/0185775 A1 | 7/2014 | Tang |
| 2015/0245463 A1 | 8/2015 | Nighan, Jr. |

OTHER PUBLICATIONS

U.S. Appl. No. 16/147,509, Notice of Allowance and Notice of References dated Mar. 18, 2019.
U.S. Appl. No. 16/147,459, Office Action dated Jul. 30, 2019.
PCT/US2019/032869, International Search Report dated Aug. 6, 2019.

* cited by examiner

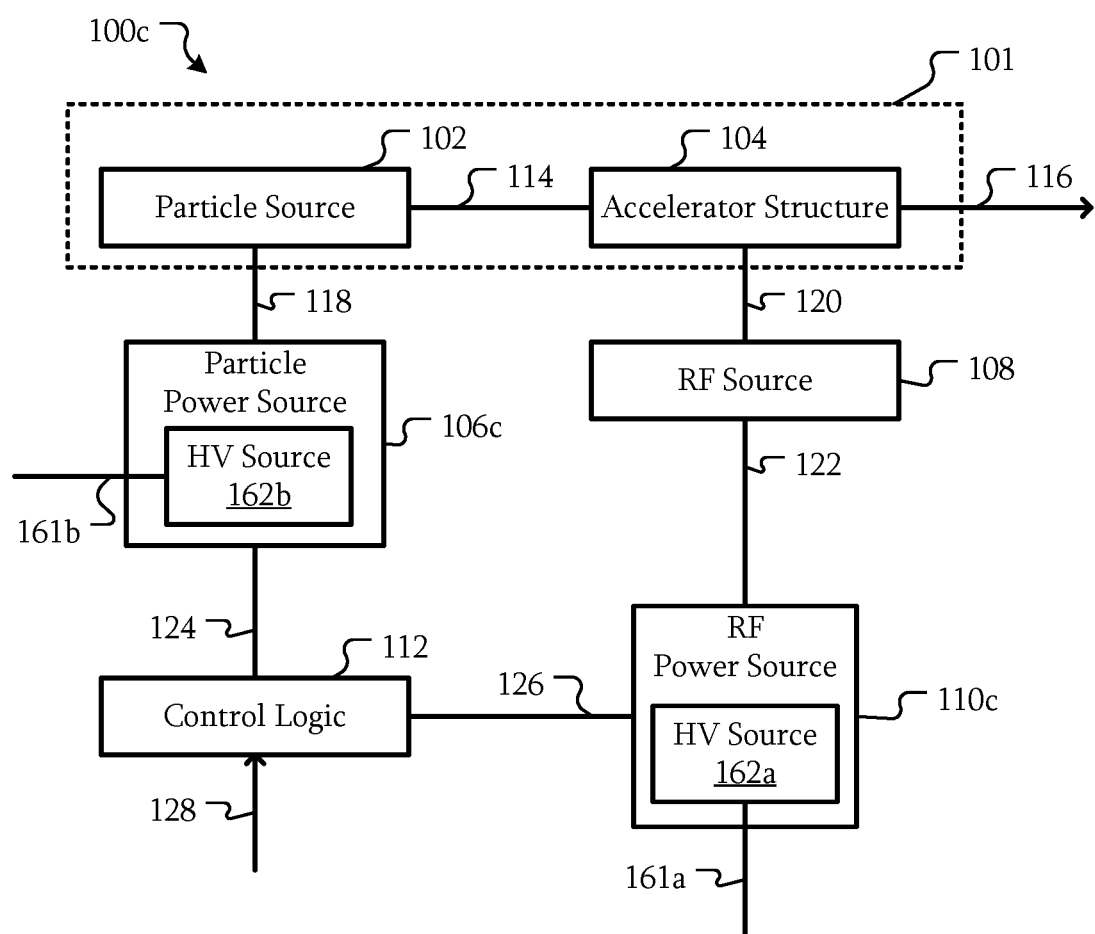

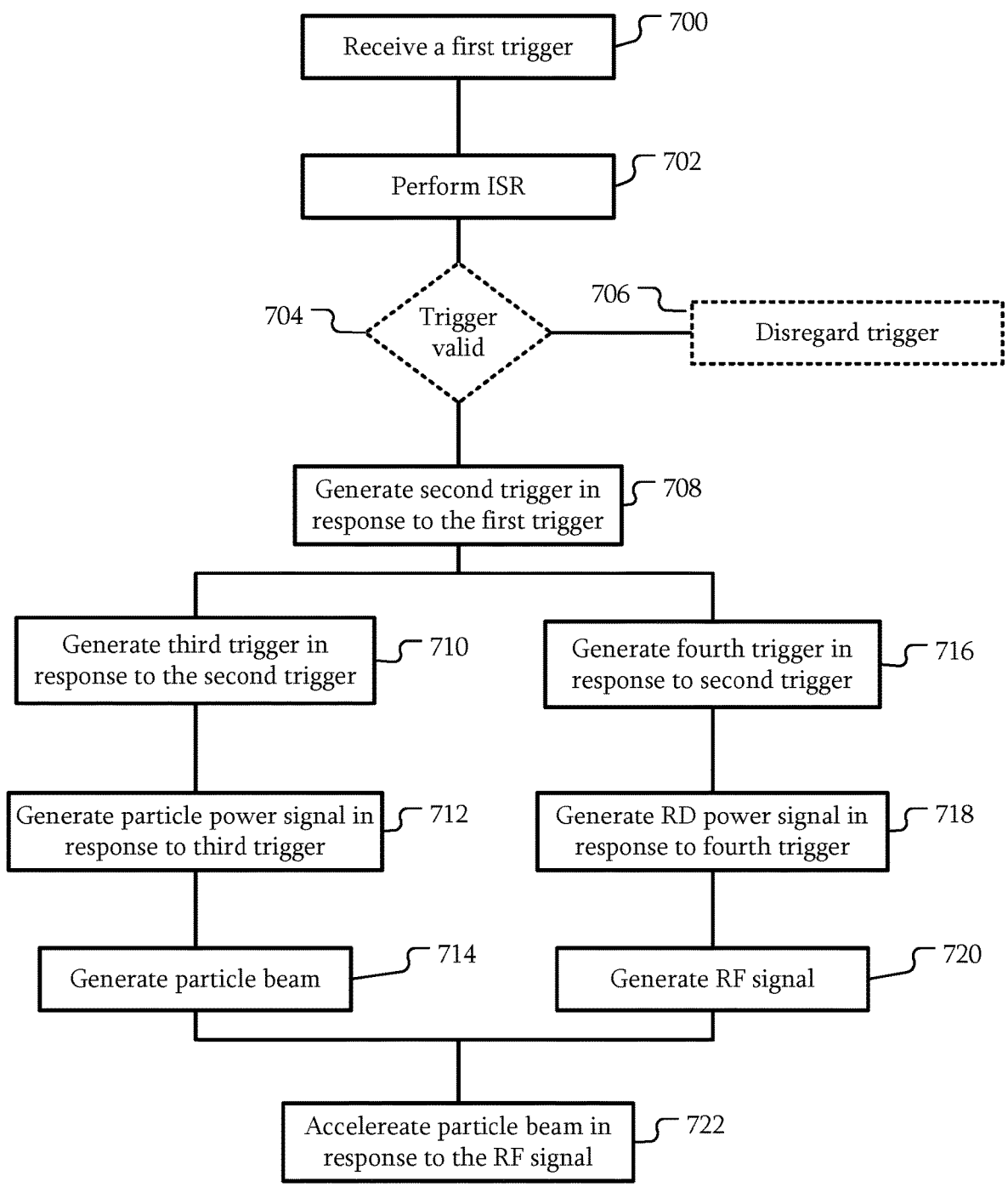

CONFIGURABLE LINEAR ACCELERATOR

BACKGROUND

This disclosure relates to configurable linear accelerators, and trigger distribution systems and frequency control systems for configurable linear accelerators.

Linear accelerators are used in systems such as sophisticated medical, security inspection, communication, sterilization, and food irradiation systems. The linear accelerator may be used as part of a system that generates ionizing radiation including x-rays, gamma rays, or electron beams. Some linear accelerators generate pulses of accelerated particles by pulsing power supplied to a particle source and power to an RF source. Some linear accelerators have fixed levels and timing for the power supplied to a particle source and power supplied to an RF source, fixing the energy and dose rate (e.g., the timing and amplitude) for the pulses. Other linear accelerators may switch between two or more factory-defined modes where each mode has an associated power supplied to the particle source and power supplied to the RF source. The timing of the supplied power is the same for each mode. Moreover, the mode is switched based on a predefined pattern, alternating between the two modes.

BRIEF DESCRIPTION OF SEVERAL VIEWS OF THE DRAWINGS

FIGS. 1A-C are block diagrams of configurable linear accelerators according to some embodiments.

FIG. 7A-7B are flowcharts illustrating techniques of distributing a trigger in a configurable linear accelerator according to some embodiments.

DETAILED DESCRIPTION

Linear accelerators typically use a particle source configured to generate a particle beam, such as an electron source. The particle beam is directed through an accelerator structure. The accelerator structure is a resonant structure that uses an input RF signal to accelerate the particles in the particle beam. The accelerated particle beam is generated by pulsing the particle source to generate a pulse of particles directed at the accelerator structure. The RF signal accelerates the particles to generate the accelerated particle beam. As will be described in further detail below, the particle source and the RF source may be independently controlled during operation. In addition, timing of the particle source and RF source, and/or frequency control of the RF source will be described in further detail below.

Figure 1A:
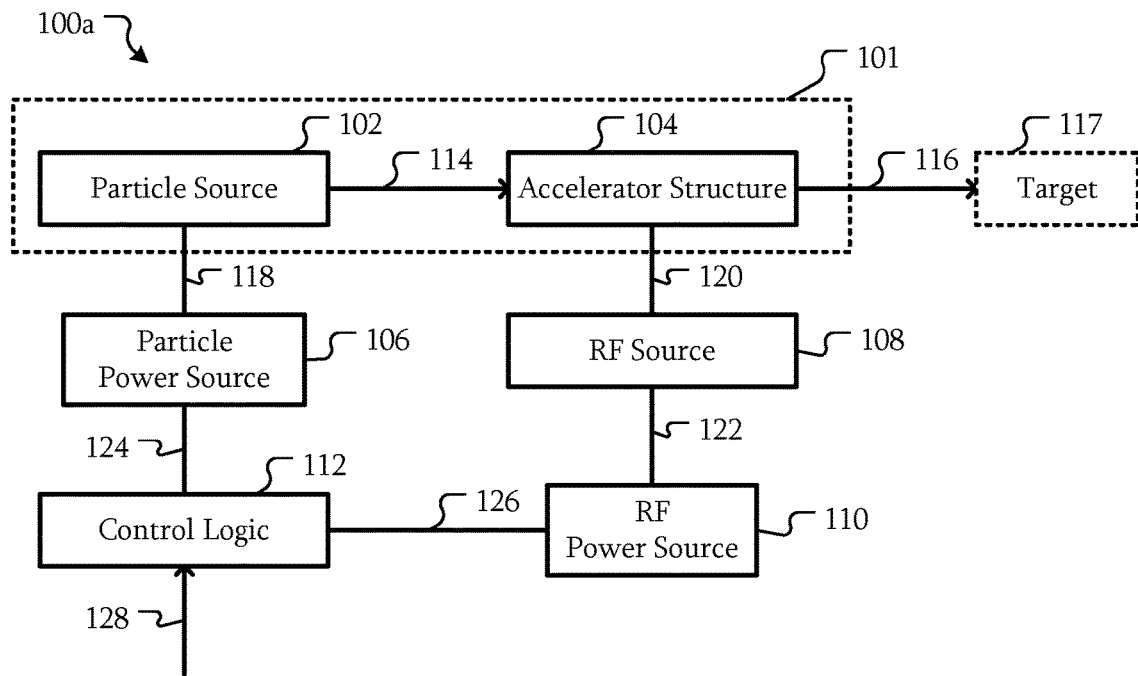
Figure 1B:
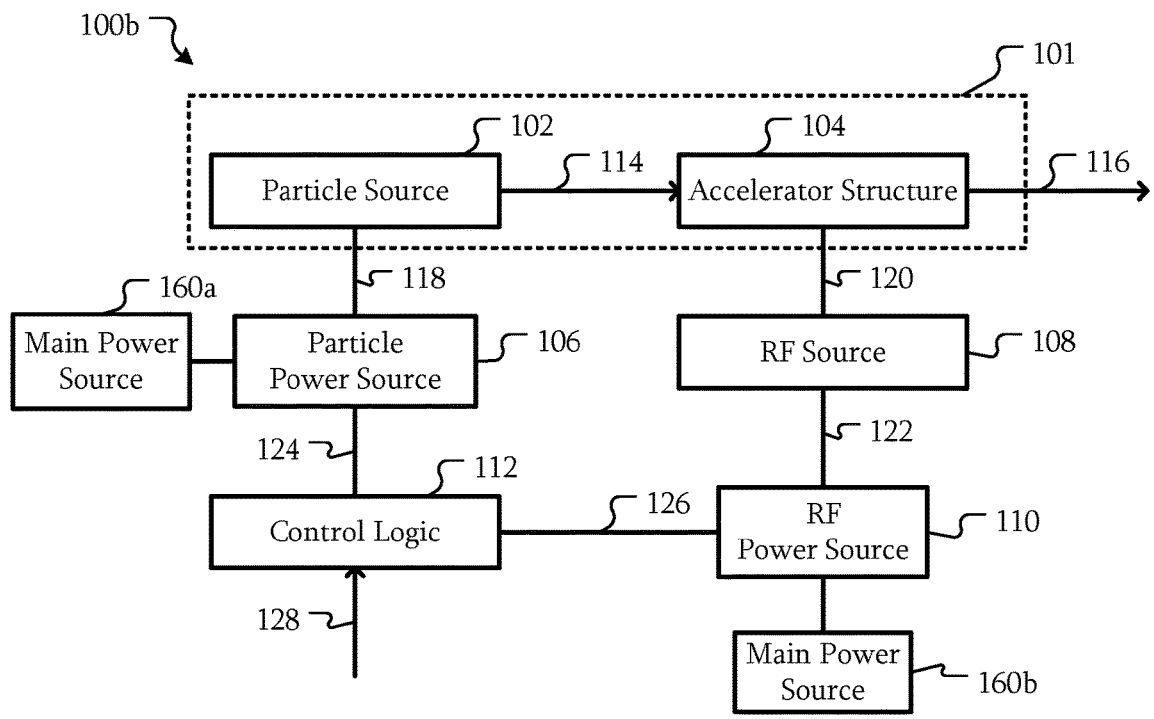

FIGS. 1A-1C are block diagrams of configurable linear accelerators according to some embodiments. Referring to FIG. 1A, a linear accelerator system (or system or accelerator-based system) 100a includes a particle source 102, an accelerator structure 104, and an RF source 108. The accelerator structure 104 and particle source 102 may be disposed within an enclosure 101, such as a vacuum enclosure, vacuum tube, or the like.

The particle source 102 is a device or system configured to generate a particle beam 114 in response to the particle power signal. For example, the particle source 102 may be an electron gun, an ion source, or other device configured to generate a beam of charged particles. The particle source 102 is configured to generate the particle beam 114 in response to a particle power signal 118. In an example, the particle source 102 can be a diode electron gun, which has two separate electric potentials, including a cathode and focusing electrode coupled to a first voltage and an anode coupled to a second voltage. In another example, the particle source 102 can be a triode electron gun, which has three separate electric potentials, including the cathode and focusing electrode coupled to a first voltage, the anode coupled to a second voltage, and control grid, typical above the surface of the cathode, coupled to a third voltage between the first voltage and the second voltage.

The particle power signal 118 is a signal that causes the particle source 102 to generate the particle beam 114. For example, in some embodiments, the particle power signal 118 includes a high-voltage pulse, such as a pulse having an amplitude of 3 kilovolts (kV) to 39 kV. The high-voltage pulse may have a pulse width of about 2-5 microseconds (µs); however, in other embodiments, the pulse width may be different.

A particle power source 106 is a device or system configured to generate the particle power signal 118. The particle power source 106 includes pulse generation circuitry including circuitry to control at least one of the amplitude, delay, and pulse width of a pulse in the particle power signal 118. For example, the particle power source 106 may include high voltage power supplies, solid state or other high voltage/high current switches, transformer networks, inductor-capacitor (LC) or resonant pulse shaping networks, one or more energy storage devices such as capacitors, inductors, or the like. The particle power source 106 may also include control logic as will be described below.

In some embodiments, the particle power source 106 is configured to change the generation of pulses of the particle power signal 118 such that a current pulse has one or more of the amplitude, delay, and pulse width different from those of a previous pulse. That is, the pulse characteristics may be varied from pulse to pulse. In some embodiments, the particle power source 106 is configured to generate pulses having a discrete number of parameters. For example, the choice of amplitude of the pulse may be selectable from a finite set of two or more amplitudes. However, in other embodiments, the choice may be continuous, variable by an analog or digital setting, substantially continuous with digital steps that are relatively small, or the like. Although an amplitude has been used as an example of a parameter that may be changed in discrete and continuous manners, in other embodiments, other parameters may be changed in similar manners.

In some embodiments, the particle power signal 118 may not be a signal that provides the power to generate the particle beam 114, but instead modulates the particle source 102. For example, the particle power signal 118 may be a control signal, such as a grid voltage signal for a triode electron gun. In this example, the particle source 102 may include a connection for a constant high-voltage source (not illustrated) configured to provide a high-voltage cathode voltage. The particle power signal 118 provides modulation of the particle beam 114.

The RF source 108 is a device or system configured to generate an RF signal 120 in response to the RF power signal 122. For example, the RF source 108 may be a magnetron, low power RF source coupled to a klystron RF amplifier, or other RF source 108 capable of generating microwave RF signals in L, S, C, X, or other frequency bands as the RF signal 120. Microwaves are a form of electromagnetic radiation with wavelengths ranging from one meter (1 m) to one millimeter (1 mm) with frequencies between 300 megahertz (MHz; 1 m) and 300 gigahertz (GHz; 1 mm), which can include ultra high frequency (UHF; 300 MHz to 3 GHz), super high frequency (SHF; 3 to 30 GHz), and extremely high frequency (EHF; millimeter wave; 30 to 300 GHz). With electromagnetic energy ranging from approximately 1 GHz to 100 GHz in frequency, the microwave spectrum can be further categorized in bands, such as L (1-2 GHz), S (2-4 GHz), C (4-8 GHz), X (8-12 GHz), Ku (12-18 GHz), K (18-26.5 GHz), Ka (26.5-40 GHz), Q (33-50 GHz), U (40-60 GHz), V (50-75 GHz), W (75-110 GHz), F (90-140 GHz), and D (110-170 GHz). Band L is associated with UHF, bands S through Ka are associated with SHF, and bands Q through D are associated with EHF.

The RF power signal 122 is a signal that causes the RF source 108 to generate the RF signal 120. In some embodiments, the RF power signal 122 includes a high-voltage pulse, such as a pulse generated by a magnetron having an amplitude of approximately 20 kV to 45 kV, or a pulse generated by a klystron having an amplitude of approximately 100 kV to 135 kV. The high-voltage pulse may have a pulse width of about 2-5 microseconds (μs). However, in some embodiments, the pulse amplitude and width may be different than the above examples.

An RF power source 110 is a device or system configured to generate the RF power signal 122. The RF power source 110 includes pulse generation circuitry including circuitry to control at least one of the amplitude, delay, and pulse width of a pulse in the RF power signal 122. For example, the RF power source 110 may include high voltage power supplies, solid state or other high voltage/high current switches, transformer networks, LC pulse shaping networks, one or more energy storage devices such as capacitors, or the like. The RF power source 110 may also include control logic as will be described below.

In some embodiments, the RF power source 110 is configured to change the generation of pulses of the RF power signal 122 such that a current pulse has one or more of the amplitude, delay, and pulse width different from those of a previous pulse. That is, the pulse characteristics may be varied from pulse to pulse. In some embodiments, the RF power source 110 is configured to generate pulses having a discrete number of parameters. For example, the choice of amplitude of the pulse may be selectable from a finite set of two or more amplitudes. However, in other embodiments, the choice may be continuous, variable by an analog or digital setting, substantially continuous with digital steps that are relatively small, or the like. Although an amplitude has been used as an example of a parameter that may be changed in discrete and continuous manners, in other embodiments, other parameters may be changed in similar manners.

In some embodiments, one or more aspects of the particle power signal 118 and the RF power signal 122 may be different. For example, in some embodiments, a timing of the RF power signal 122 is different of the particle power signal 118. In other embodiments, a delay and/or pulse width may be different between the particle power signal 118 and the RF power signal 122. In other embodiments, other aspects of the pulses may be different between the particle power signal 118 and the RF power signal 122. In addition, although single aspects have been described as being different, in some embodiments, multiple aspects of pulses may be different between the particle power signal 118 and the RF power signal 122.

The accelerator structure 104 is configured to accelerate the particle beam 114 in response to the RF signal 120 to generate an accelerated beam 116. For example, the accelerator structure 104 may be a traveling wave (TW), standing wave (SW) structure, a hybrid TW-SW structure, or another type of resonant structure. The accelerator structure 104 may include multiple electrodes, waveguide structures, or the like configured to receive the RF signal 120 and apply that signal to the particle beam 114 to generate the accelerated beam 116.

In some embodiments, the particle beam 114 may be a pulsed electron beam. A pulse of electrons is directed towards the accelerator structure 104. The RF signal 120 may be a pulsed RF signal. As a result, an accelerated electron beam 116 with pulses of accelerated particles may be generated, directed at a target 117 to generate x-rays, or used for other purposes. For simplicity, the target 117 will not be illustrated in other figures; however, the accelerated particle beams described herein may also be directed towards a target 117. Moreover, in some applications a target 117 may not be used. For example, a sterilization system may use the accelerated electron beam 116 itself instead of using it to generate x-rays.

In linear accelerators, the character of the pulses in the accelerated particle beam 116 is dependent on the input particle beam 114 and the RF signal 120. A given set of pulses of a particle power signal 118 and a RF power signal 122 with a particular timing generate corresponding pulses in the particle beam 114 and the RF signal 120 which in turn generate a corresponding pulse in the accelerated particle beam 116 having a particular energy and dose rate. Dose rate is the quantity of radiation absorbed per unit of time. Some linear accelerators systems use common LC networks and transformers to generate signals similar to the particle power signal 118 and a RF power signal 122. A single high-voltage power source may charge a bank of capacitors, which are part of an LC network, that are discharged into a transformer network to generate both the signals. Once the bank of capacitors is charged, the output pulse was formed by discharging the capacitors into the transformer network through a thyratron. Once the thyratron is switched on, the capacitors would discharge through the thyratron until discharged. The resulting pulse width is dependent on the capacitor charge and transformer network and the delay is dependent on the control logic. A thyratron is a type of gas-filled tube used as a high-power electrical switch and controlled rectifier. Because of the high current or high-voltage, solid state switches have not been used.

This common source links the timing of the two signals of conventional linear accelerators systems. If the timing of one is changed, the timing of the other changes as well. A different energy and dose may be selected by changing the charge on the capacitors and in other systems, different taps of the transformer network may allow for different amplitudes. Regardless, the timing of the two is fixed. That is, the pulse width and the delays are the same. Even if from pulse to pulse, an amplitude of one of the signals may be changed, the timing remains dependent. Furthermore, the energy and dose rate combinations were conventionally set at design time, not configurable by the user in the field, and followed a set pattern.

The particle power source 106 and the RF power source 110 are responsive to a corresponding control signal 124 and 126, respectively. Control logic 112 is coupled to the particle power source 106 and the RF power source 110. The control logic 112 is configured to generate the control signals 124 and 126. The control logic 112 may include a general-purpose processor, a digital signal processor (DSP), an application specific integrated circuit (ASIC), a microcontroller, a programmable logic array (PLA), device such as a field programmable logic controller (PLC), a programmable logic gate array (FPGA), discrete circuits, a combination of such devices, or the like. The control logic 112 may include internal portions, such as registers, cache memory, processing cores, counters, timers, comparators, adders, or the like, and may also include external interfaces, such as address and data bus interfaces, interrupt interfaces, or the like. Other interface devices, such as logic circuitry, memory, communication interfaces, or the like may be part of the control logic 112 to connect the control logic 112 to particle power source 106 and the RF power source 110 and other components. The operation of the control logic 112 will be described in further detail below with respect to FIGS. 2A-2H. While the control logic 112 is illustrated as separate from the particle power source 106 and the RF power source 110, in some embodiments, the circuitry of the control logic 112 may be distributed between a separate component, the particle power source 106, and the RF power source 110 to perform the operations described below.

FIG. 1B is a block diagram of a configurable linear accelerator according to some embodiments. The system 100b may be similar to the system 100a. However, in some embodiments, one or both of the particle power source 106 and the RF power source 110 may receive power from a main power source 160. Here, both the particle power source 106 and the RF power source 110 receive power from the main power source 160; however, in other embodiments, the particle power source 106 and the RF power source 110 may receive power from other sources, such as a high-voltage source.

Here, two different main power sources 160a and 160b are illustrated. In some embodiments, the power supplied to the particle power source 106 and the RF power source 110 are different. For example, the main power source 160b may be configured to supply single-phase alternating current (AC) 230V power while the main power source 160a may be configured to supply three-phase AC 400V power. In other embodiments, the magnitude of the power may be different, the main power sources 160a and 160b may be the same power source or provide similar power, or the like.

The particle power source 106 and the RF power source 110 are each configured to generate the corresponding particle power signal 118 or RF power signal 122 from the corresponding main power source 160a or 160b, respectively. In particular, the particle power source 106 and the RF power source 110 are not configured to generate pulses in the corresponding particle power signal 118 or RF power signal 122 in response to a common high-voltage pulse. Instead, the pulse forming circuitry used to generate each of the particle power signal 118 or RF power signal 122 is instead within the corresponding particle power source 106 or RF power source 110.

FIG. 1C is a block diagram of a configurable linear accelerator according to some embodiments. The system 100c may be similar to the system 100a and 100b. However, in some embodiments, the RF power source 110c includes a high-voltage source 162a and the particle power source 106c includes a high-voltage source 162b. That is, the RF power source 110c and the particle power source 106c include separate high-voltage power sources 162a and 162b.

Each of the RF power source 110c and the particle power source 106c is configured to generate the associated RF power signal 122 or particle power signal 118 from a high-voltage from the associated high-voltage source 162a or 162b. The high-voltage sources 162a and 162b are configured to receive an input power 161a and 161b, respectively. In some embodiments, the input powers 161a and 161b may be from a main power source such as the main power sources 160b and 160a of FIG. 1B. However, in other embodiments, the input power 161a and 161b may be generated by a common high-voltage source. Accordingly, each of the high-voltage source 162a and 162b may be configured to generate a different internal high-voltage, charge internal capacitors, or the like associated with generating the associated RF power signal 122 or particle power signal 118.

Figure 2A:
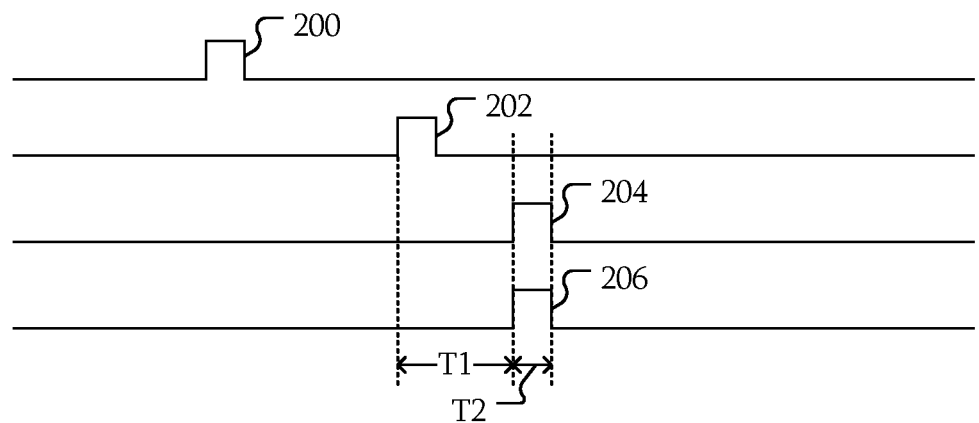
FIGS. 2A-2H are timing diagrams illustrating various signals in a configurable linear accelerator according to some embodiments.

FIGS. 2A-2H are timing diagrams illustrating various signals in a configurable linear accelerator according to some embodiments. System 100a of FIG. 1A will be used as an example; however, the signals and timing described herein may apply to other embodiments, such as the systems 100b and 100c of FIGS. 1B and 1C. Referring to FIGS. 1A and 2A, in some embodiments, a message 200 and a corresponding trigger 202 may be received by the control logic 112 as the control signal 128. In some embodiments, the message 200 and trigger 202 may be communicated to the control logic 112 through a common communication interface, such as a single serial interface, a parallel interface, or the like. However, in other embodiments, the message 200 and trigger 202 may be communicated on separate interfaces. For example, the message 200 may be communicated through a serial or parallel interface through which data may be communicated; however, the trigger 202 is communicated through a single line, pin, wire, transmission line, differential pair, or the like. Although particular examples of communication links or interfaces are described above, in other example, the communication links or interfaces may be different.

The message 200 is a signal that includes indications of settings for an upcoming pulse. For example, the message 200 may include an indication of one or more parameters of an amplitude and timing of the particle beam 114, RF signal 120, particle power signal 118, RF power signal 122, or the like. The indication of the parameter may take a variety of forms, such as the absolute value of the parameter, a relative value of the parameter, a percentage of a predefined value of the parameter, a percentage of a maximum value for the parameters, an index into a look-up table for the parameter, or the like.

In some embodiments, configuration information may have been previously transmitted to the control logic 112. For example, the configuration information may include information associating an index to a particular value of a parameter. For example, an index of 0 may be associated with a voltage of 20 kV for the RF power signal 122 and an index of 1 may be associated with a voltage of 40 kV. As a result, the message 200 may contain merely the index to specify the particular voltage for the RF power signal 122.

In response to receiving the message 200, the control logic 122 may communicate to the particle power source 106 and the RF power source 110 information based on the message 200 for the upcoming pulse using the control signals 124 and 126, respectively. This information may or may not be in the same form as what was received by the control logic 112. For example, in some embodiments the control logic 112 may forward the configuration information for the upcoming pulse to the particle power source 106 and the RF power source 110. In other embodiments, the control logic 112 may transform the information, such as by transforming a desired energy and dose into amplitude and timing parameters for the particle power source 106 and the RF power source 110. In some embodiments, the control logic 112 may transform the information into source-specific information that may then be further transformed by the particle power source 106 and the RF power source 110. For example, the control logic 112 may transform the information into indexes which the particle power source 106 and the RF power source 110 transform into amplitude and timing information.

Trigger 202 represents a signal received by the control logic 112. For example, the trigger 202 may be a trigger received from a larger system, such as a cargo scanning system, that includes the system 100a. The trigger 202 indicates a point in time from which the pulses of the particle power signal 118 and RF power signal 122 will be generated.

The message 200 and the trigger 202 are offset in time with the trigger occurring later. This offset in time may allow for the content of the message 200 to be communicated to various portions of the system 100a and/or allow for the various portions to prepare for an upcoming pulse. For example, one or both of the particle power source 106 and RF power source 110 may need time to charge a bank of capacitors, configure switches, or perform other operations to be prepared to generate the corresponding particle power signal 118 and RF power signal 122 after the trigger 202 is received. In response to receiving a message 200, the control logic 112 may communicate with the particle power source 106 and the RF power source 110 to establish the parameters for an upcoming pulse, such as by communicating amplitude and timing information, communicating indexes to look-up-tables previously communicated to the particle power source 106 and the RF power source 110, or the like. In response, the particle power source 106 and the RF power source 110 may prepare for generating the corresponding particle power signal 118 and the RF power signal 120.

The control pulses 204 and 206 represent the control of the pulses of the particle power signal 118 and RF power signal 122, respectively. The control logic 112 is configured to receive the trigger 202 and, in response, cause the control pulses 204 and 206 to be generated. In some embodiments, the control pulses 204 and 206 may be communicated from the control logic 112 to the particle power source 106 and the RF power source 110. However, as will be described below, control of the overall system 100a may be distributed across various subsystems with message and trigger information communicated from the control logic 112 to those subsystems. For example, the control logic 112 may receive initial configuration information that is then divided and communicated to the particle power source 106 and the RF power source 110.

Once the trigger 202 is received, the control pulses 204 and 206 are generated in response. In some embodiments, the control pulses 204 and 206 may be generated as soon as possible in response to the trigger 202. However, in other embodiments, the control pulses 204 and 206 may be generated after a delay. Here, the control pulses 204 and 206 are generated after a delay T1. The control pulses have a pulse width of T2. As illustrated, the control pulses 204 and 206 have the same delay T1 and pulse width T2; however, as will be described below, the delay and pulse width may be different.

Although the trigger 202 is illustrated as a pulse, in some embodiments, the trigger information is communicated through the edge of the trigger 202. Here, the edge is a rising edge, but in other embodiments, the edge may be a falling edge. In addition, although the trigger 202 is illustrated as having a particular width, in other embodiments, the width may be different. For example, the trigger 202 may have a width that is greater than a threshold. The trigger 202 may be processed to filter out spurious triggers. The threshold width may be used as a criterion for determining whether the trigger 202 is a valid trigger. The delay T1 may allow for time to determine whether the trigger 202 is a valid trigger before triggering the control pulses 204 and 206.

Figure 2B:
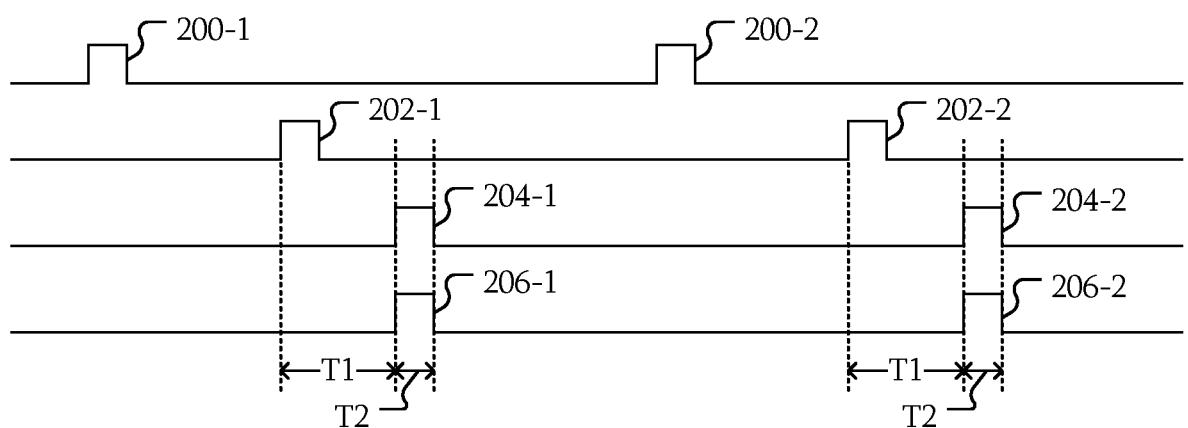

Referring to FIGS. 1A and 2B, in some embodiments, multiple messages 200 and triggers 202 may be received. In this example, two messages 200-1 and 200-2 are received. After each message 200 is received, a corresponding trigger 202 is received. Here, trigger 202-1 triggers control pulses 204-1 and 206-1 based on the message 200-1. Similarly, trigger 202-2 triggers control pulses 204-2 and 206-2 based on the message 200-2. Here, the control pulses 204-1, 204-2, 206-1, and 206-2 have the same delay T1 and the same pulse width T2. Each of the messages 200-1 and 200-2 may have specified the same parameters. In other embodiments, the message 200-1 may have specified the parameters while the message 200-2 indicated that the last set of parameters should be used.

The messages 200 and/or triggers 202 may be separated in time by a controllable period. In some embodiments, the resulting control pulses 206 may occur at a controllable pulse repetition frequency (PRF). Thus, a series of the control pulses 206 may be separated in time by a period equal to the inverse of the pulse repetition frequency, i.e., 1/PRF. For a given series of control pulses 206, the period between the pulses 206 may be substantially the same. However, in other embodiments, the period between the pulses 206 may be variable between groups of pulses or single pulses.

The message 200-2 has been illustrated as being later in time relative to the trigger 202-1 and control pulses 204-1 and 206-1. For example, in some embodiments, the delay of the message 200-2 may be used to allow for processing of data acquired by a system including the system 100a. However, in other embodiments, the timing may be different. For example, the message 202-2 may be communicated during a time of the trigger 202-1 and control pulses 204-1 and 206-1.

Figure 2C:
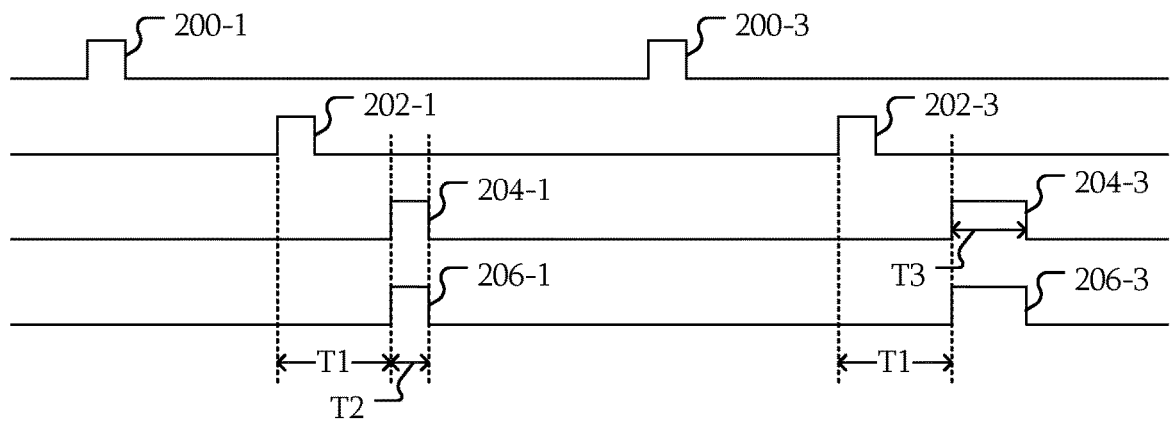

Referring to FIGS. 1A and 2C, the timing may be similar to that of FIG. 2B. However, the message 200-3 indicates that while the delay may be the same T1, the pulse width is a different time T3. For example, the message 200-3 may have indicated a relative increase in the pulse width T3, a different absolute pulse width T3, a different mode having the pulse width T3, or the like. Regardless, once the pulse is triggered by trigger 202-3, the different pulse width T3 is used. Thus, the pulse width may be changed from pulse to pulse. Although only two pulses and the associated triggers are illustrated, the pulse width may be changed for each subsequent trigger and the associated pulse. Multiple consecutive triggers and the associated pulses may have the same parameters, some different parameters, or all different parameters.

Figure 2D:
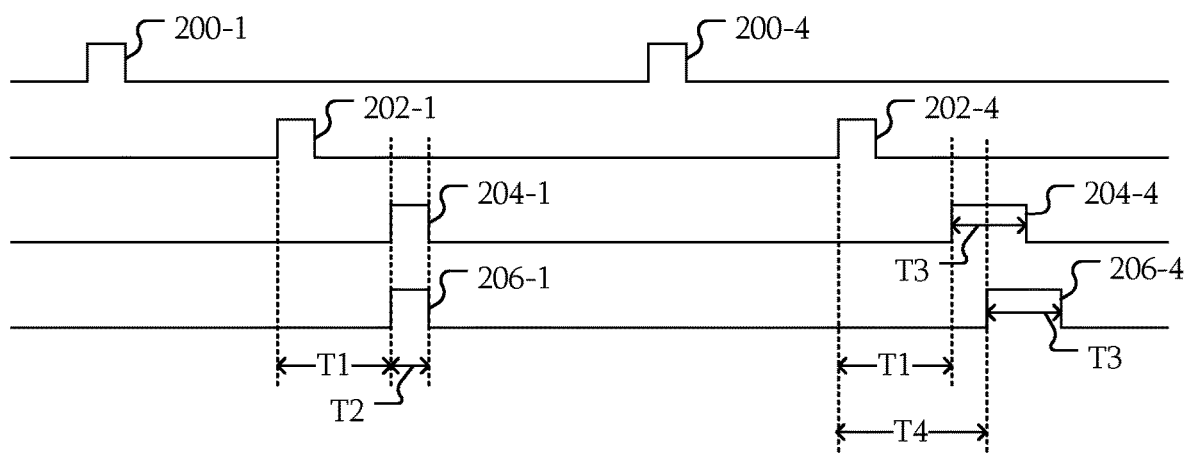

Referring to FIGS. 1A and 2D, the timing may be similar to that of FIG. 2C. However, the message 200-4 includes a different pulse delay T4 for control pulse 206-4. Here, the message 200-4 included an indication of the different pulse delay T4. The different pulse delay T4 may have been communicated in the message 200-4 in a variety of ways as described above. Although a different delay for the control pulse 206-4 has been used as an example, the delay may be different for the control pulse 204-4 or different for both control pulses 204-4 and 206-4. That is, one or both of the control pulses 204-4 and 206-4 may have the different pulse delay T4. Moreover, the delay of the control pulses 204-4 and 206-4 may be different from each other in addition to being different from the delay T1.

In the various timing diagrams described above, examples of the pulse width and delay for the control pulses 204 and 206 have been used as examples. In other embodiments, any combination of pulse width and delay for the control pulses 204 and 206 may be used with some different and others the same between current control pulses 204 and 206 and previous control pulses 204 and 206. Furthermore, while the difference has been described with respect to two consecutive pulses, the various differences may be present between each and any of the pulses, regardless of whether any are identical or have similarities.

Figure 2E:
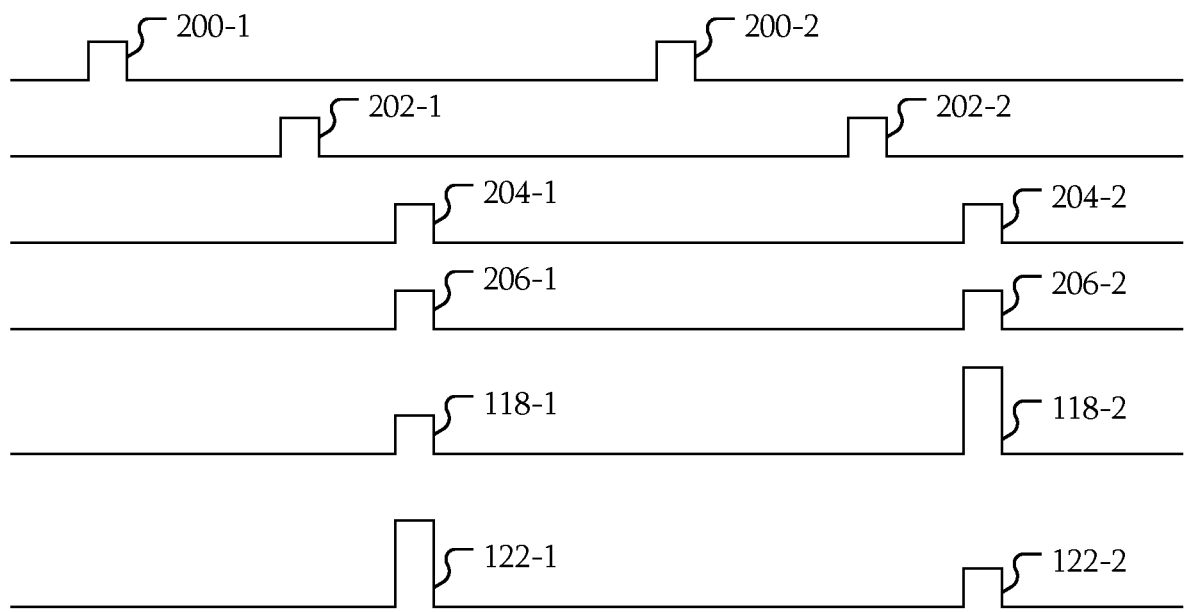

Referring to FIGS. 1A and 2E, the timing may be similar to that of FIG. 2B. In some embodiments, the amplitude of the signal or signals indicated in the message 200 may be different from pulse to pulse. While the timing of FIG. 2B is used as an example, the amplitude or amplitudes that are varied may be varied as in the other timing examples of FIGS. 2C and 2D or other timing changes may be made.

The control pulses 204-1 and 204-2 are associated with power pulses 118-1 and 118-2, respectively, of the particle power signal 118. Similarly, the control pulses 206-1 and 206-2 are associated with power pulses 122-1 and 122-2, respectively, of the RF power signal 122. The first message 200-1 may specify amplitudes for the power pulses 118-1 and 122-1. In response to the trigger 202-1, the amplitudes are set accordingly in power pulses 118-1 and 122-1.

The second message 200-2 specifies different amplitude for both the power pulses 118-2 and 122-2. As a result, in response to trigger 202-2, the amplitudes are set accordingly. Although an increase in amplitude of both power pulses 118 and 122 has been used as an example, the amplitude of any particular power pulse may not change, may decrease, and may change by different magnitudes.

As described above, the timing and amplitude of power pulses 118 and 122 may be different for each power pulse 118 and 122 from pulse to pulse and the power pulses 118 and 122 may be different from each other. In some embodiments, the amplitude of one or more of the power pulses 118 and 122 may be changed within a pulse. The voltage, pulse width, pulse delay, and other characteristics of the pulses may be independent and/or different. The RF signal 120 and particle beam 114 may have similar corresponding characteristics as a result, affecting the accelerated particle beam 116. In addition, although two pulses have been used as an example, in other embodiments, the sequence of pulses with different parameters may be three or more.

Figure 2F:
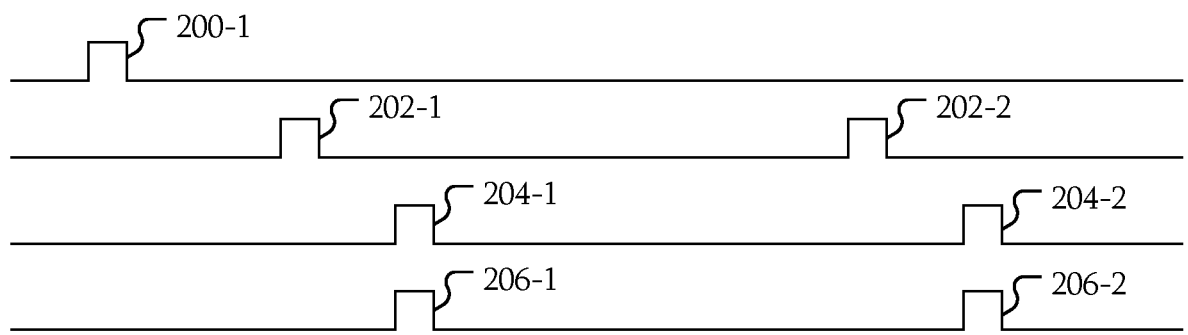

Referring FIG. 2F, in some embodiments, a single message may be associated with multiple triggers. For example, the timing in FIG. 2E may be similar to that of FIG. 2B. However, the single message 200-1 is used to specify settings for pulses triggered in response to triggers 202-1 and 202-2. In this example, the settings are the same as a subsequent trigger 202-2 may merely trigger pulses with the most recent settings. However, in other embodiments, the settings may be different according to information specified in the message. For example, the message 200-1 may include information for two or more different subsequent pulses. In another example, the message 200-1 may define how the pulses will change on subsequent triggers, such as an increasing or decreasing amplitude or timing, a pattern for the changes, or the like. After each trigger, the particle power source 106 and the RF power source 110 may be reconfigured to generate a different pulse to be ready for the next trigger 202. For example, the control logic 112 may begin reconfiguring the particle power source 106 and the RF power source 110 after generating the control pulses 204-1 and 206-1 to be ready for the trigger 202-2. In some embodiments, the association of a single message with multiple triggers may allow for higher pulse rates as a message 200 is not transmitted for every pulse.

Figure 2G:
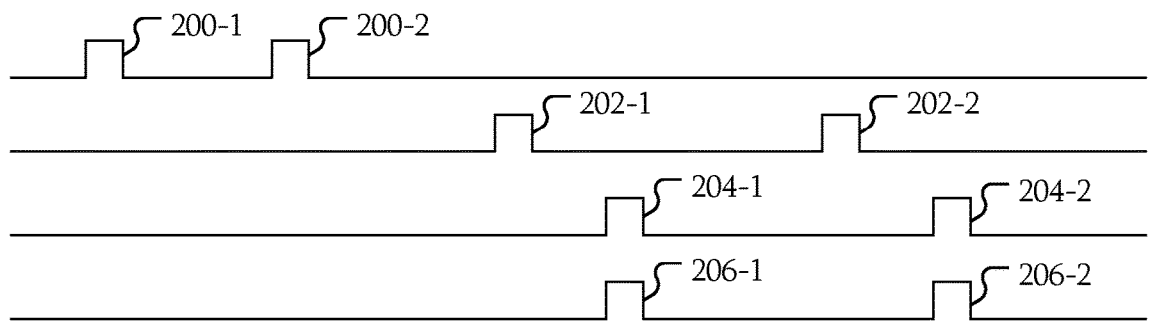

Referring to FIG. 2G, the timing may be similar to that of FIG. 2B. However, the messages 200-1 and 200-2 that defined the associated pulses were received before the trigger 202-1 for the first of the pulses. The second pulse may be triggered in response to trigger 202-2 as defined by message 200-2. Accordingly, multiple pulses may be communicated to the control logic 112 which then triggers associated control pulses 204 and 206 in response to the corresponding trigger 202.

Regardless of how the association of a message 200 and a trigger 202 is established, in some embodiments, each trigger 202 results in a pulse. The message 200 information may be conveyed as described herein at a rate such that the trigger 202 may generate a pulse at less than 30 to about 1000 pulses per second or more.

Figure 2H:
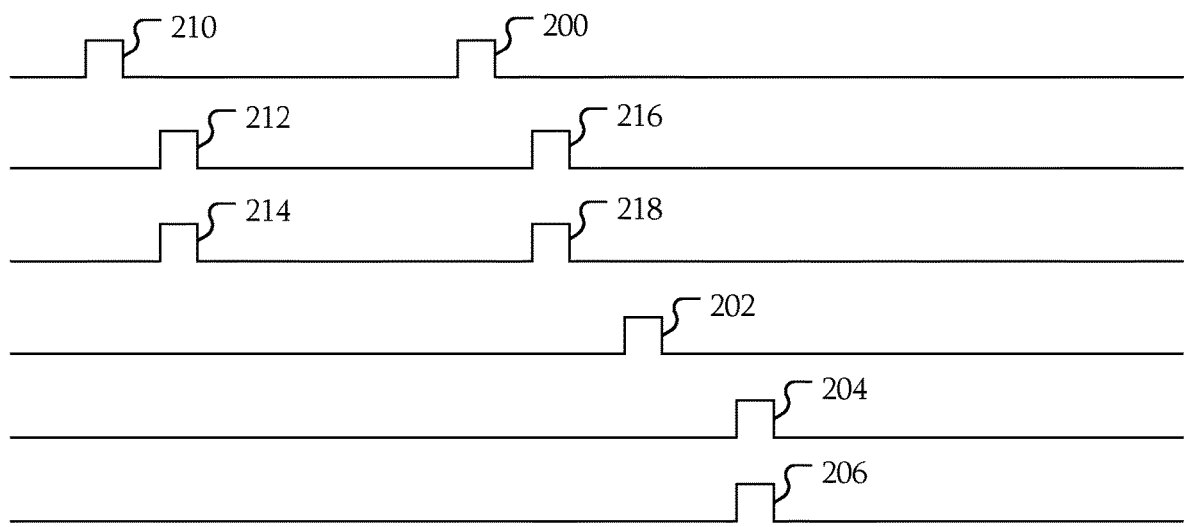

Referring to FIG. 2H, the timing may be similar to that of FIG. 2A. However, initial configuration information and communication of pulse information is also illustrated. In some embodiments, at an earlier time, information 210 is communicated to the control logic 112. This information 210 includes the configuration information for the control logic, the particle power source 106, the RF power source 110, or the like.

In response to the information 210, the control logic 112 may communicate system-specific information to various sub-systems. For example, particle source information 212 may be communicated to the particle power source 106 and RF source information 214 may be communicated to the RF power source 110. The information 212 and 214 may each contain the system-specific information such as timing information, amplitude information, look-up-tables, calibration information, or the like as described above.

While the information 210 is illustrated as a single packet of information, the communication of the information 210 may be spread over time, communicated over a series of operations, or the like. Similarly, the system-specific information 212 and 214, may be similarly communicated in a variety of ways. In some embodiments the information 210, 212, and 214 are communicated after the system 100a is turned on, but before any pulses have occurred. However, in other embodiments, the information 210, 212, and 214 may be communicated at any time such that the various subsystems such as the particle power source 106 and the RF power source 110 have the information to appropriately respond to a message 200 and trigger 202, including being communicated immediately before the message 200 and trigger 202. Moreover, while the communication of information 210, 212, and 214 has been illustrated as being in series with the message 200 and trigger 202, in some embodiments, the communication of information 210, 212, and 214 may occur while pulses are being generated. For example, as will be described below, in some embodiments, multiple communication links may connect the control logic 112 to other sub-systems. The message 200, trigger 202, and information 210, 212, and 214 may be communicated over these communication links in parallel.

Although communication of information to the particle power source 106 and the RF power source 110 have been used as examples, in other embodiments, additional information may be communicated to other sub-systems. For example, information may be communicated to a frequency control system for the RF source 108, as described below. Moreover, in some embodiments, the information for the particle power source 106 and the RF power source 110 may be communicated together. For example, the control logic 112 may communicate the information for the particle power source 106 and the RF power source 110 to a modulator sub-system that then communicates the specific information to the particle power source 106 and the RF power source 110.

In some embodiments, by having independent particle power source 106 and RF power source 110, the timing may be changed as described above. Moreover, in some embodiments, both the timing and the amplitude may be changed. This allows for independent control of energy and dose rate of a resulting output pulse in the accelerated particle beam 116. For example, a user may set an energy of 4 MV and change the dose as desired. The energy may be set for a series of pulses by setting the parameters of the RF power source 110, but the timing and/or amplitude of the particle power source 110 may be varied to vary the dose or dose rate. In a specific example, during a scan of a vehicle, the dose rate may be significantly reduced when scanning a portion of a vehicle including the operator of the vehicle. The dose rate may be higher for pulses when scanning other portions of the vehicle including the cargo. For example, the reduced dose rate may be variable from 0.01 to 0.20 rads/minute (rads/min.) at a particular pulse repetition frequency while the higher dose rate may be variable from 1 rad/min. to 30 rads/min. at the same pulse repetition frequency. As a result, the vehicle operator may not need to exit the vehicle during a scan, increasing throughput. In addition, a user may want to change the energy, such as changing between 4 MV, 5 MV and 6 MV, or the like. The independence of the particle power source 106 and RF power source 110 allows this operation, including changing the energy and then varying the dose for that energy. In an example, the flexibility of changing the energy and dose rate can provide better material discrimination (MD) from the scan.

Accordingly, a user may use the control logic 112 to setup and select from a discrete number to an arbitrary number of modes with a variety of dose and energy combinations. In some embodiments, a variety of modes may be established, but only a subset is transmitted to the system 100a as described above. If a different set of available modes is desired, another subset may be transmitted to the system 100a as described above. The latter subset may or may not overlap with the former subset. Although a subset of modes has been used as an example, in some embodiments, configuration information for all possible modes may be transmitted to the system 100a as described above.

The independence of the particle power source 106 and RF power source 110 allows for a single design to operate similarly to multiple previous designs. In addition, the particular dose and energy combinations need not be known when the system 100a is ordered. If desired dose and energy combinations change during the design process by a system integrator, a different system is not needed as long as the new dose and energy combinations are within the configurability of the system 100a. The user may change the operating conditions as desired.

Figure 3A:
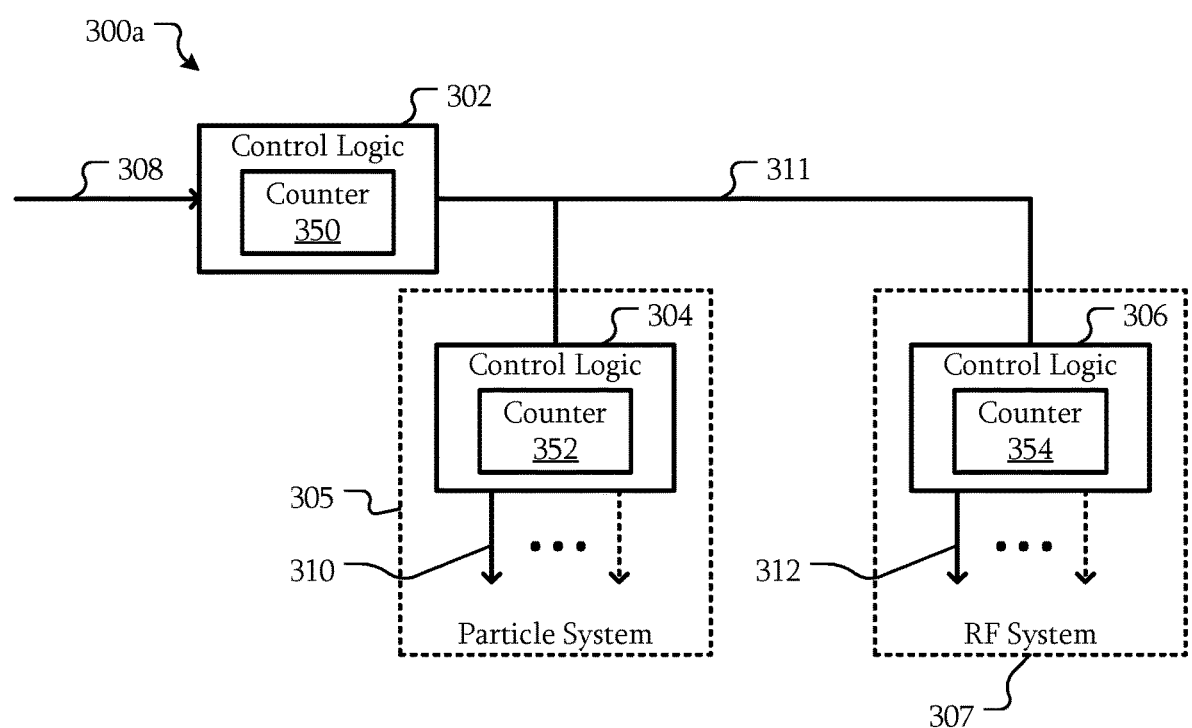
FIGS. 3A-3B are a block diagrams of a trigger distribution system in a configurable linear accelerator according to some embodiments.
Figure 3B:
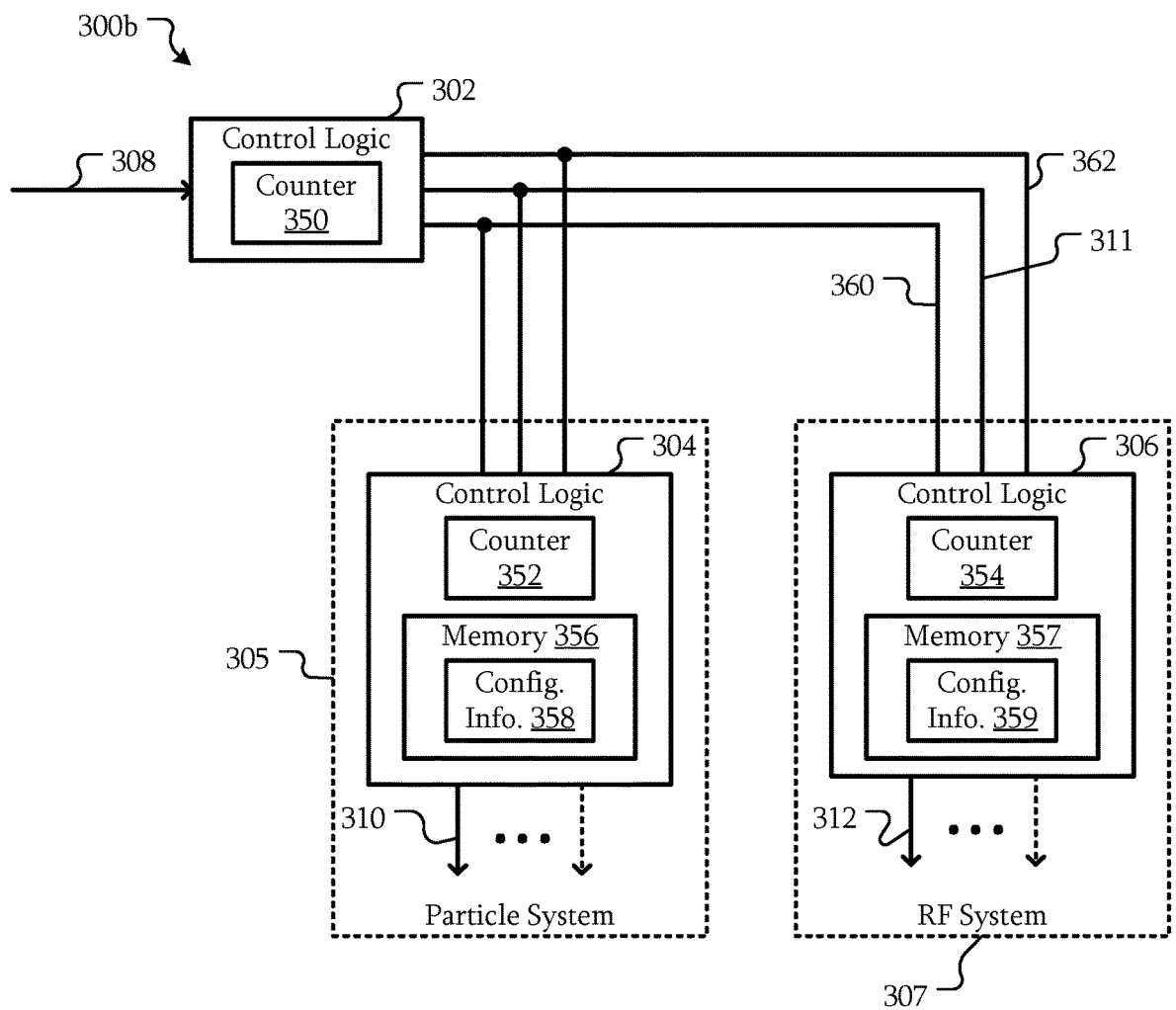
Figure 4A:
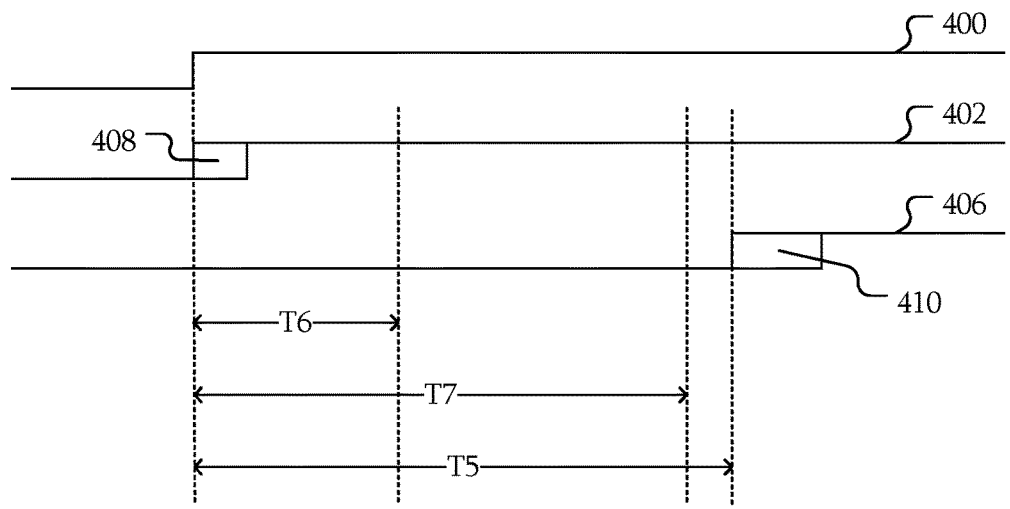
FIG. 4A-4B are timing diagrams of signals in a trigger distribution system in a configurable linear accelerator according to some embodiments.
Figure 4B:
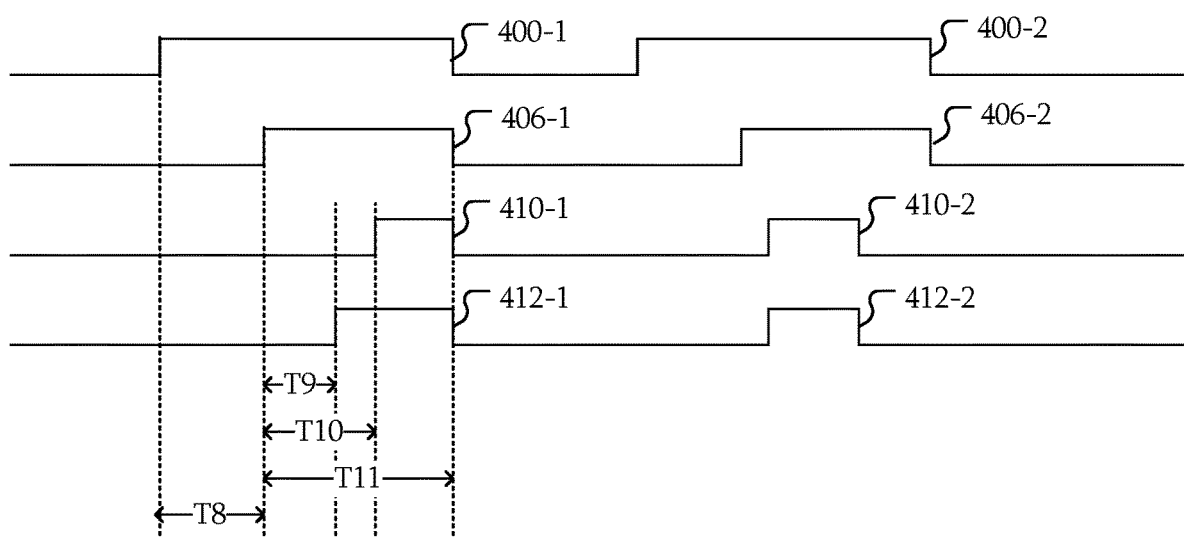

FIGS. 3A-3B are block diagrams of a trigger distribution system in a configurable linear accelerator according to some embodiments. The system 100a of FIG. 1A will be used as an example; however, the trigger distribution system 300a may be used in other embodiments, such as those of FIGS. 1B and 1C or the like. FIGS. 4A-4B are timing diagrams of signals in a trigger distribution system in a configurable linear accelerator according to some embodiments.

Referring to FIGS. 1A, 3A, and 4A, the trigger distribution system 300a includes first, second, and third control logic 302, 304, and 306 connected to a trigger bus 311. The control logic 302 may be a part of the control logic 112. The control logic 304 may be part of a particle system 305 including the particle source 102 and particle power source 106. The control logic 306 may be part of an RF system 307 including the RF source 108 and the RF power source 110. Although the particle system 305 and the RF system 307 are the only similarly situated systems illustrated, in other embodiments, the trigger distribution system 300a may include other systems connected to the trigger bus 311.

Each of the control logic 302, 304, and 306 may include a general-purpose processor, a digital signal processor (DSP), an application specific integrated circuit (ASIC), a microcontroller, a programmable logic array (PLA), device such as a field programmable logic controller (PLC), a programmable logic gate array (FPGA), discrete circuits, a combination of such devices, or the like. Each of the control logic 302, 304, and 306 may include internal portions, such as registers, cache memory, processing cores, counters such as counters 350, 352, and 354, timers, comparators, adders, or the like, and may also include external interfaces, such as address and data bus interfaces, interrupt interfaces, or the like. Other interface devices, such as logic circuitry, memory, communication interfaces, or the like may be part of each of the control logic 302, 304, and 306 to connect the control logic 302, 304, and 306 to particle power source 106, and the RF power source 110, internal components of those sources 106 and 110, and/or other components. Moreover, although the particle system 305 and the RF system 307 are illustrated as having a single control logic 304 and 306, respectively, in some embodiments, the systems may be subdivided into multiple systems, each with their own control logic with a connection to the trigger bus 311.

Trigger input 308 is an input to control logic 302 through which a trigger 400 may be received from a user. The trigger 400 may be received from a larger system that includes the system 300a. For example, the trigger 400 may be generated by a user interface system of the larger system. Regardless of its source, as described above, the trigger 400 may be received in a variety of ways through a variety of interfaces. In some embodiments, the trigger input 308 is a single input, line, pin, differential input, or the like.

The trigger bus 311 may take a variety of forms. For example, the trigger bus 311 may be a single electrical connection between a trigger output of the control logic 302 and a trigger input of the control logic 304 and 306. In other embodiments, the trigger bus 311 may include multiple lines, such as one for each downstream control logic such as control logic 304 and 306.

Control logic 302 is configured to receive the trigger 400 and generate another trigger 406 on the trigger bus 311 in response to the trigger 400. The second trigger 406 has a delay relative to the trigger 400 of a configurable number of cycles of a counter of the control logic 302. For example, the control logic 302 may include an oscillator, such as a crystal oscillator circuit. That oscillator may be used to cycle a counter of the control logic 302. The control logic 302 may be configured to capture a state of the counter at the time the rising edge of the trigger 400 is received. The control logic 302 may be configured to output the trigger 406 after a configurable number of cycles of that counter. Here, time T5 represents that delay.

Signal 402 represents the time represented by the state of the counter 350 relative to the trigger 400. Variability 408 represents the uncertainty of the value of the counter 350 due to factors such as a stability of the oscillator, logic gate delays, and a period of the counter. Trigger 406 is generated based on the count of the counter 350 plus the configurable number of cycles of the counter 350. Thus, the trigger 406 has an uncertainty based on that of the signal 402 and additional factors such as the stability of the oscillator, logic gate delays, and the period of the counter 350. The result is that the trigger 406 generates a delay T5 from the trigger 400 with uncertainty 410.

In addition to generating the trigger 406, the control logic 302 may be configured to perform an interrupt service routine in response to the trigger 400. Times T6 and T7 represent a minimum and maximum expected processing time for the interrupt service routine to finish execution. The difference between times T6 and T7 may be larger than the uncertainty 410. The time T5 is larger than the maximum expected processing time for the interrupt service routine, that is, larger than time T7. As a result, the occurrence of the trigger 406 is based on the properties of an oscillator rather than on when a processor may end execution of an interrupt service routine. In other words, the delay in generating the trigger 406 may mask larger uncertainties within the control logic 302, resulting in a smaller uncertainty. In a particular example, a desired delay may be 10 μs+/−2 μs. However, an uncertainty of the end of execution of an interrupt service routine may be +/−3 μs. By masking the uncertainty of the interrupt service routine, the higher accuracy may be achieved.

Referring to FIGS. 1A, 3A, and 4B, the control logic 302 is connected to trigger bus 311. Two triggers 400-1 and 400-2 are illustrated. Using trigger 406-1 as an example, the control logic 302 is configured to generate the corresponding trigger 406-1 on the trigger bus 311 as described above. Each of the control logic 304 and 306 is configured to receive the trigger 400-1 and generate a trigger 410-1 or 412-1, respectively in response. Each of these triggers 410-1 and 412-1 may be generated in a manner similar to that of the trigger 406. That is, a counter 352 and 354 of the associated control logic 304 and 306 is used in the generation of the triggers 410-1 and 412-1.

The triggers 410-1 and 412-1 represent signals on control interfaces 310 and 312 of the control logic 304 and 306, respectively. Triggers 410-1 and 412-1 and control interfaces 310 and 312 are merely examples. Although only one control interface is illustrated for each of the control logic 304 and 306, in other embodiments, one or both may have more than one control interface 310 or 312 and be configured to communicate more than one corresponding trigger 410-1 or 412-1. Although the signals 410 and 412 are referred to as triggers, the signals may be control pulses as described above.

As described above, the particle system 305 may include the particle power source 106 and particle source 102. In response to the trigger 410-1, the particle power source 106 is configured to generate a particle power signal 118. The particle source 102 is configured to generate the particle beam 114 in response to the particle power signal 118. Similarly, the RF system 307 may include the RF power source 110 and the RF source 108. In response to the trigger 412-1, the RF power source 110 is configured to generate a RF power signal 122. The RF source 108 is configured to generate the RF signal 120 in response to the RF power signal 122. Accordingly, the particle beam 114 and the RF signal 120 to generate the accelerated particle beam 116 may be triggered in response to a common trigger 400-1 that resulted in other triggers being distributed through the system 300a to synchronize the timing.

The operation in response to trigger 400-2 may be similar to that described with respect to trigger 400-1. However, as described above, parameters for the pulse may have changed. Accordingly, the timing of the triggers 410-2 and 412-2 may be different than triggers 410-1 and 412-1 and the operation of the system may be different.

Referring to FIGS. 1A, 3B, 4A, and 4B, the trigger distribution system 300b may include additional communication links between the control logic 302, 304, and 306. Here, two communication links 360 and 362 are illustrated; however, in other embodiments, only one or more than two communication links may be used. The communication links 360 and 362 may include any communication link that allows the control logic 302, 304, and 306 to communicate information. For example, the communication links 360 and 362 may include serial communication links, parallel communication links, a controller-area-network (CAN) bus, an inter-integrated circuit (I2C) bus, Modbus, Ethernet, or the like.

The control logic 304 and 306 may include memory 356 and 357 for configuration information 358 and 359. In some embodiments, the configuration information 358 and 359 may be communicated through communication link 360. For example, the configuration information 358 may include a look-up-table (LUT) including an association of an index, pulse width, pulse delay, and amplitude for a pulse of the particle system 305. The configuration information 358 may include multiple similar entries to define multiple different potential pulses of the particle system 305. Similarly, the configuration information 359 may include a look-up-table (LUT) including an association of an index, pulse width, pulse delay, and amplitude for a pulse of the RF system 307. The configuration information 359 may include multiple similar entries to define multiple different potential pulses of the RF system 307.

Although storing configuration information 358 and 359 has been described as using a LUT, in other embodiments, other techniques may be used. For example, the configuration information 358 and 359 may include parameters for equations defining pulse width, pulse delay, and amplitude for a pulse of the corresponding system.

In some embodiments, different types of information may be communicated on the different communication links 360 and 362. In some embodiments, communication link 360 may be a higher-speed communication link while communication link 362 may be a slower-speed communication link. Time sensitive information may be sent on the higher-speed communication link 360 while configuration information is sent over the slower-speed communication link 362. For example, the configuration information 358 and 359 may be communicated to the particle system 305 and the RF system 307, respectively, over the slower communication link 362. However, information regarding an upcoming pulse may be communicated over the higher-speed communication link 360. In a particular example, for a pulse rate of 500 pulses per second, the communication of information regarding an upcoming pulse, the configuration of various systems such as the particle system 305 and RF system 307, the triggering of the pulse, and the actual pulse itself must occur less than 2 milliseconds (ms). The high-speed communication link 360 must be capable in this example of communicating the information regarding an upcoming pulse in a fraction of that time to allow for time for the other operations associated with a pulse.

Figure 5A:
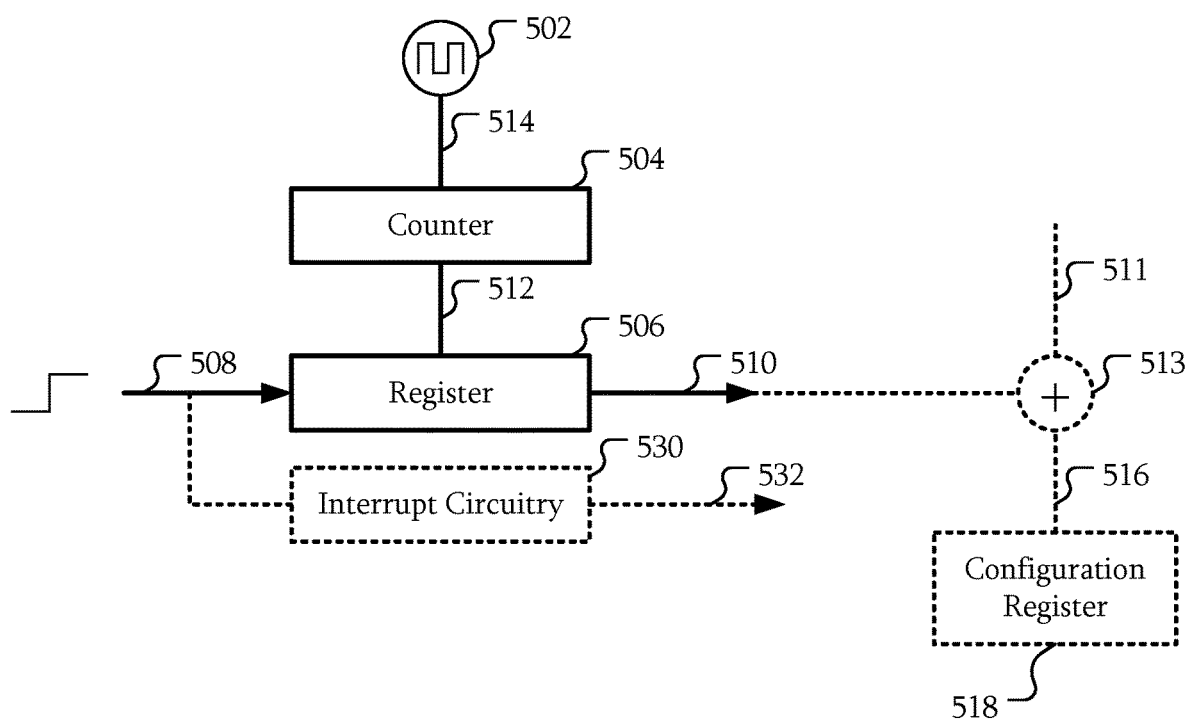
FIGS. 5A-5B are block diagrams of input and output circuits of a trigger distribution system in a configurable linear accelerator according to some embodiments.
Figure 5B:
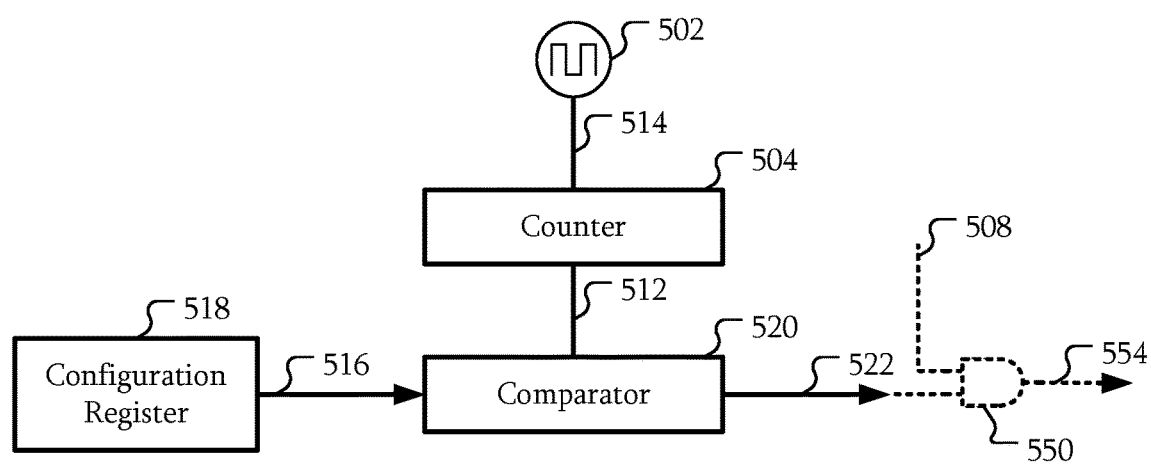

FIGS. 5A-5B are block diagrams of input and output circuits of a trigger distribution system in a configurable linear accelerator according to some embodiments. In some embodiments, the circuits may be used in control logic of a configurable linear accelerator such as the control logic 112, 302, 304, 306, 812, or the like as described herein. Referring to FIG. 5A, in some embodiments, an input circuit for receiving a trigger 508 may include an oscillator 502, a counter 504, and a register 506. The oscillator 502 is configured to generate a clock signal 514 used to increment the counter 504. The counter 504 is configured to output a value 512 of the counter. The trigger 508 is used to store the current value 512 of the counter 504 in the register 506.

In some embodiments, the trigger 508 may also cause interrupt circuitry 530 to set an interrupt flag 532. As a result, a processor may process an interrupt related to the trigger 508. For example, as described above, an interrupt service routine may be performed to determine if the trigger 508 is a valid trigger. In some embodiments, the interrupt service routine may check the state of the trigger 508 to determine if the trigger 508 has remained in a high state for a time equal to or greater than a threshold. For example, the state of the trigger 508 may be checked while the current value of the counter 504 is less than a sum of the threshold and the value of the counter 504 stored in the register 506. If the trigger 508 is not in a high state during that time, the trigger 508 may be disregarded as a spurious trigger, also referred to as a glitch.

Referring to FIG. 5B, in some embodiments, an output circuit includes the oscillator 502 and the counter 504. The oscillator 502 and the counter 504 may be the same circuits, separate but synchronized circuits, or a combination of similar circuits. Regardless, the counter 504 continues to output an incrementing value 512. The configuration register 518 is configured to store a value 516. The comparator 520 is configured to compare the configuration register value 516 and the counter value 512 to generate a comparison result 522.

Referring to FIGS. 5A and 5B, in operation, once a trigger 508 is received, the register 506 may store the current counter 504 value 512. This value may then be output as the stored value 510. A delay 511 in number of cycles of the counter 504 may be added to the stored value 510 in an adder 513 to generate a value 516. The value 516 may be stored in the configuration register 518 and compared against the current value 512 of the counter 504. As a result, once the counter 504 reaches the value 516, i.e., the sum of the stored value 510 and the delay 511, an output 522 may be generated, triggering an action, such as triggering a pulse of the particle power signal 118 or the RF power signal 120, or triggering another sub-system.

In some embodiments, a gating circuit, such as AND gate 550, may be used to gate an input trigger 508. The trigger 508 may have a pulse width greater than the delay time plus the maximum pulse width. Once the counter 504 reaches the value 516, i.e., the stored value 510 plus the delay 511, the output 522 enables gate 550, the trigger 508 is gated to generate output 554. The output 554 may be used similar to the output 522 described above. A similar circuit with another configuration register 518 storing a sum of the initial value, the delay cycles, and pulse width cycles may be used to generate another comparison result 522 that is used to deactivate the output 554.

In some embodiments, circuits such as those described herein may be implemented with input capture and output compare circuits of a microcontroller. In particular, as the various control logic, such as the control logic 302, 304, and 306, are distributed across a system, the microcontroller including such circuitry may reduce or eliminate a need for external trigger distribution circuitry. Each sub-system in the system may include a microcontroller with input capture and output compare circuits.

Although a microcontroller has been used as an example, in other embodiments, different circuits may be used to implement the trigger distribution. For example, a programmable logic device, such as a field-programmable gate array (FPGA), a programmable logic array (PLA) or other similar circuit, may be used to implement the trigger distribution circuitry. In another example, an application specific integrated circuit (ASIC) may be used to implement the trigger distribution circuitry.

Referring back to FIGS. 1A, 3B, 4B, 5A, and 5B, times T8-T11 represent various delays associated with configuration registers 518 described above. For example, a value for T8 may be stored in a configuration register 518 or other memory of the control logic 302. Thus, the trigger 406 may be generated after some number of cycles according to the value for T8 stored in the configuration register 518 after the rising edge of the trigger 400.

Values for T10 and T11 may be stored in configuration registers 518 of the control logic 304 for the particle system 305, such as being stored in the memory 356 as part of the configuration information 358 or in other registers of the control logic 304. Accordingly, the control pulse 410 may be activated a number of cycles after the rising edge of the trigger 406. The delay from the rising edge of the trigger 400 would be about the sum of the values T8 and T10. Similarly, the control pulse 410 may be deactivated T11 cycles after the rising edge of the trigger 406 or T8+T11 cycles after the rising edge of the trigger 400. Values for T9 and T11 may be similarly stored in the control logic 306 of the RF system 307, such as being stored in the memory 357 as part of the configuration information 359 or in other registers of the control logic 306, and the control pulse 412 may be generated accordingly. Although value T11 has been used as an example of a common end of the control pulses 410 and 412, in other embodiments, the values may be different for the control pulses 410 and 412.

The values T8-T11 are used to synchronize the control pulses 410 and 412. In some embodiments, the value T8 may be communicated to the control logic 304 and/or 306. The control logic 304 and/or 306 may receive an absolute delay or pulse width from a message 200. Using the stored value T8, the appropriate values for T9-T11 may be calculated. In other embodiments, the difference in the start for the values T9-T11 may be built into the configuration information communicated to the control logic 304 and 306. Thus, the control logic 304 and 306 may be able to use the exact value that value already accommodates as the current value of T8.

In some embodiments, the value T11 or similar values defining the deactivation of the control pulses 410 and 412 may be omitted. As described above, the trigger 406 and control pulses 410 and 412 may be gated versions of the trigger 400 and trigger 406, respectively. Thus, when the trigger 400 is deactivated, the trigger 406 is deactivated and, consequently, the control pulses 410 and 412 are deactivated.

By generating the triggers and control pulses as described herein, a more accurate timing may be generated to control the pulses resulting in the accelerated particle beam 116. As described above, the uncertainty in an output trigger or control pulse may be on the order of a cycle of the oscillator 502 plus logic gate delays, variations in such delays, or the like. This may be much smaller than the uncertainty of a software-based approach using an interrupt service routine. In some embodiments, as the pulses of the particle power signal 118 and the RF power signal 122 are not generated from a common power pulse, the relative timing of the pulses may depend on the accurate distribution of a trigger or control pulses to the particle power source 106 and RF power source 110.

Moreover, the trigger and control pulse generation described herein allows for configurability of the delay and pulse width. For example, registers such as configuration register 518 may be set with appropriate values to set the delay and pulse width relative to an incoming user trigger 202 described above in FIGS. 2A-2H, a trigger 406 on a trigger bus 311 as described above in FIGS. 3A-3B, or the like. Multiple such configuration registers 518 allow for the delay and pulse width of multiple pulses for multiple subsystems to be set independently and changed for each pulse.

As described above, embodiments having independent control of timing of pulses of the particle system 305 and RF system 307 no longer have a single high-voltage pulse feeding a transformer network to generate a particle power signal 118 and an RF power signal 122. For example, when the particle power source 106 and RF power source 110 each include a high-voltage power source 162 that is separate from the other for generation of the associated pulses, timing information is conveyed in a different manner. The trigger distribution systems 300a, 300b, or the like described herein are examples of how at least part of the timing information may be distributed to the various systems.

Although the triggers 202, 400, or the like have been described as being generated by an external source, in some embodiments, the triggers may be generated by an internal source. For example, an operator may define a pulse repetition frequency (PRF). The control logic 112 or the like may generate a trigger 202, 400, or the like at that frequency internally.

Although examples of trigger distribution system have been described above, in other embodiments, a configurable linear accelerator system may include different trigger distribution systems.

Figure 6A:
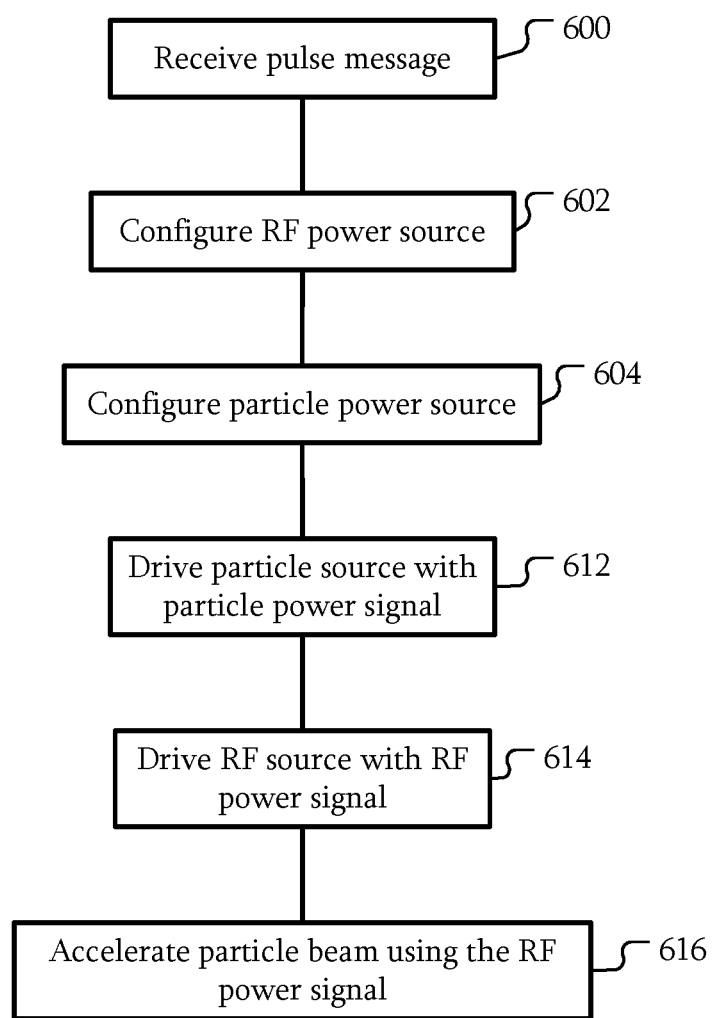
FIG. 6A-6B are flowcharts illustrating techniques of operating a configurable linear accelerator according to some embodiments.

FIG. 6A is a flowchart illustrating a technique of operating a configurable linear accelerator according to some embodiments. In 600, a pulse message is received. The pulse message may be a message similar to the message 200 described above indicating parameters for an RF power signal and a particle power signal. For example, the control logic 112 may receive a message over a communication link with absolute or relative values for a pulse of the RF power source 110 and the particle power source 106.

In 602, the RF power source is configured. For example, the control logic 112 may transmit an index, absolute value, relative value, or the like to the RF power source 110 based on the pulse message. The RF power source 110 may be directly configured by the control logic 112 or may be configured to control logic in a sub-system such as control logic 306. Regardless, the RF power source 110 may be configured such as by charging capacitors, setting states of switches, or the like to be ready for a control pulse.

In 604, the particle power source 106 is configured in a manner similar to the RF power source 110 using the associated control logic 112 and/or 304 based on the pulse message.

In 612, the particle source is driven with the particle power signal. For example, the particle power source 106 may receive a control pulse triggering a pulse in the particle power signal 118. This drives the particle source 102 to generate a particle beam 114.

In 614, the RF source 108 is driven with the RF power signal 122. Similar to the particle source 102, the RF power source 110 may receive a control pulse triggering a pulse in the RF power signal 122. Although driving the particle source in 612 is illustrated as occurring before driving the RF source in 614, the timing of 612 and 614 may occur as described above, with various pulse delays and/or pulse widths.

In 616, the particle beam is accelerated using the RF power signal from the RF source. For example, the particle source 102 directed the particle beam 114 into the accelerator structure 102 in response to the particle power signal 118. The RF signal 120 is applied to the accelerator structure 104, causing the particles of the particle beam 114 to accelerate.

Figure 6B:
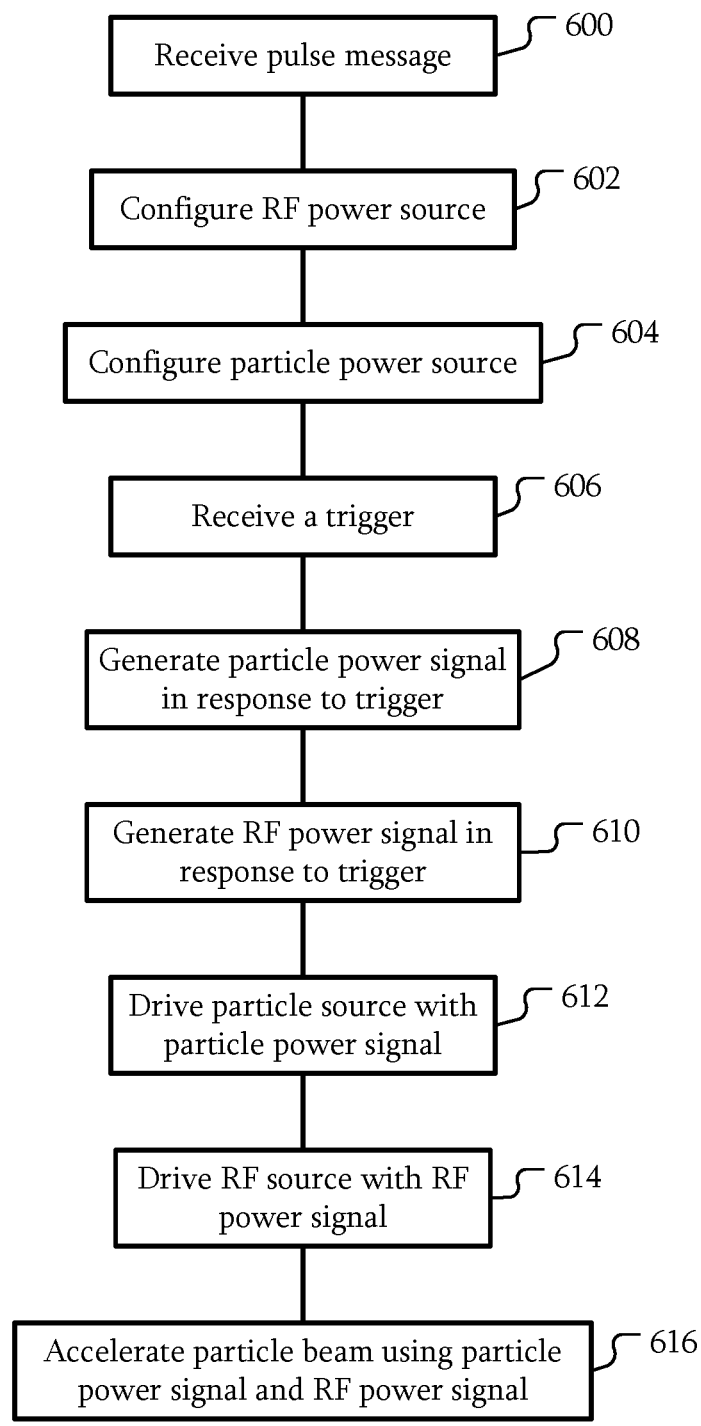

FIG. 6B is a flowchart illustrating a technique of operating a configurable linear accelerator according to some embodiments. The technique of FIG. 6B may be similar to that of FIG. 6A. However, in some embodiments, in 606 a trigger is received. For example, the control logic 112 or 302 may receive a trigger. In response in 608, the particle power signal 118 is generated and in 610 the RF power signal 122 is generated. As described above, triggers may be used by various control logic is generate control pulses used to control particle systems and RF systems.

In some embodiments, the operations described in FIGS. 6A and 6B may be repeated. For example, a second pulse message may be received in 600. The RF power source 110 and the particle power source 106 may be reconfigured based on the second pulse message in 602 and 604. The reconfiguration may be similar or identical to the process of configuring described above. As a result, the particle source 102 and RF source 108 may be driven with the reconfigured power signals in 612 and 614 such that a pulse of the accelerated particle beam 116 is generated in 616 based on the second pulse message. Although the term second has been used to describe the subsequent message, the message may be an n-th message with multiple intervening messages.

In particular, in some embodiments, the timing initiated by the first pulse message may be different from the timing of the second pulse message. For example, a timing of the second RF power signal is different from a timing of the first RF power signal or a timing of the second particle power signal is different from a timing of the first particle power signal. In some embodiments, the timing of both is different. The different timing may be established by configuring the particle power source and/or the RF power source in 602 and 604, such as by communicating new delay and pulse width parameters or indications of those parameters as described above.

Similarly, when configuring the particle power source 106 and/or the RF power source 110 in 602 and 604, the amplitude of the second RF power signal is different from an amplitude of the first RF power signal or an amplitude of the second particle power signal is different from an amplitude of the first particle power signal. In some embodiments, the amplitudes of both are different.

Figure 7A:
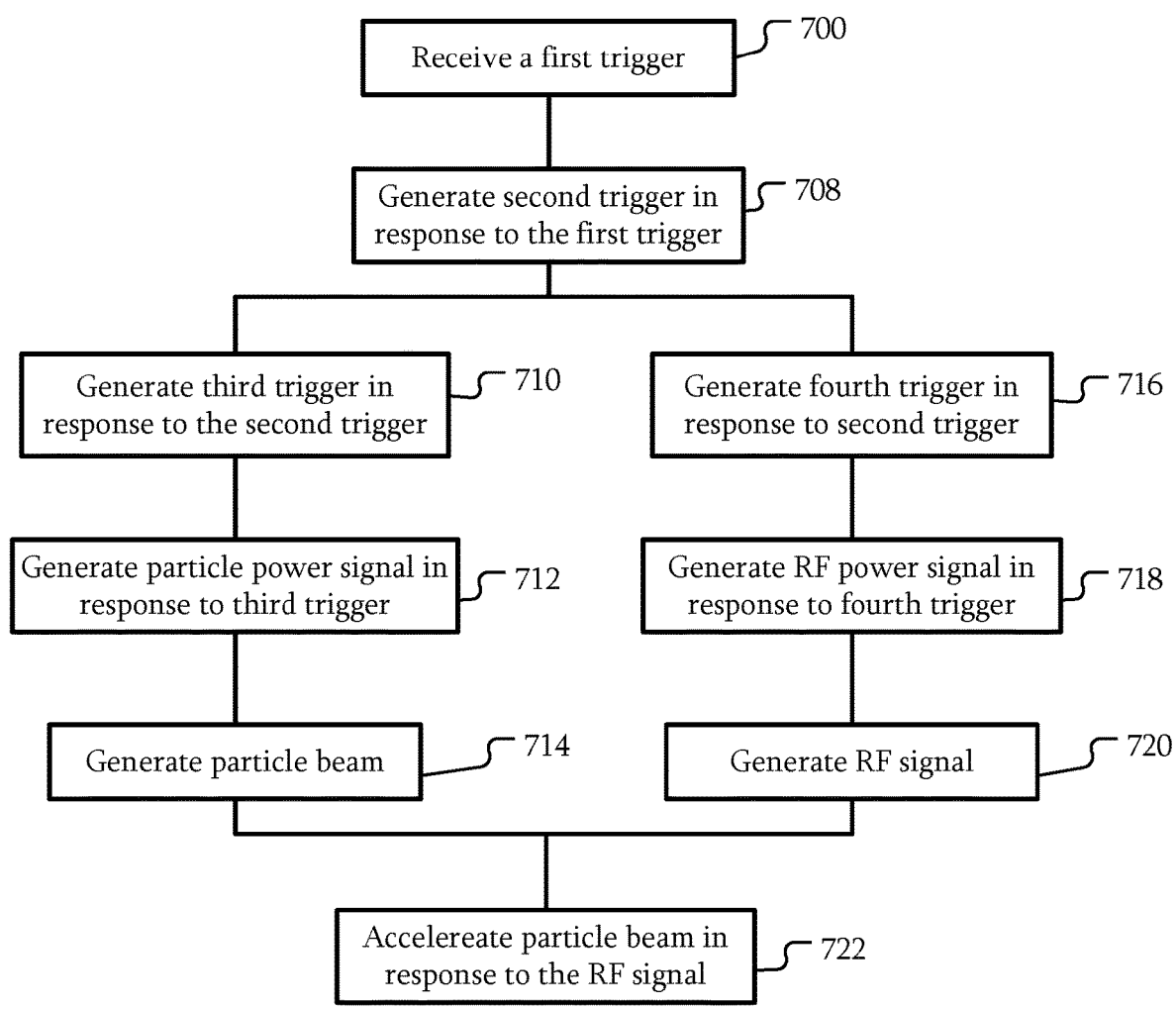

FIG. 7A-7B are flowcharts illustrating techniques of distributing a trigger in a configurable linear accelerator system according to some embodiments. Referring to FIG. 7A, in 700, a first trigger is received. In some embodiments the first trigger is a trigger from a larger system including the configurable linear accelerator system. For example, a user interface system may generate a trigger that is received by control logic 112, 302, or the like.

In response to the first trigger, a second trigger is generated in 708 having a delay relative to the first trigger of a configurable number of cycles of a first counter. Accordingly, the delay of the second trigger is based on the cycles of the first counter. The second trigger may be a trigger generated by the control logic 112, 302, or the like and the counter may be part of that control logic. The second trigger may be generated using the circuits described above, have a delay from the first trigger, be a gated version of the first trigger or the like as described above. The second trigger may be distributed to various sub-systems through a trigger bus.

In 710, a third trigger is generated in response to the second trigger. The third trigger has a delay relative to the second trigger of a configurable number of cycles of a second counter. Accordingly, the delay of the third trigger is based on the cycles of the second counter. The third trigger may be a trigger generated by the control logic 304 or the like and the counter may be part of that control logic. The third trigger may be generated using the circuits described above, have a delay from the second trigger, be a gated version of the second trigger or the like as described above.

In 712, the particle power signal is generated in response to the third trigger. As described above, the particle power source 106 may be configured to generate a particle power pulse having a particular delay, pulse width, and amplitude.

In 714, the particle beam is generated in response to the particle power signal. As described above, the particle power pulse may be generated and supplied to the particle source to generate a pulse in the particle beam.

In some embodiments, the third trigger may be used to generate a control pulse. In generating the control pulse, the third trigger may be used as the control pulse or used to establish a delay. The control pulse may be a pulse with the appropriate delay and pulse width relative to the first trigger. In some embodiments, a second configurable number of cycles of the second counter is used to generate the control pulse. The second configurable number of cycles of the second counter may define the pulse width. Thus, both the delay and the pulse width may be defined by the cycles of a counter.

In 716, a fourth trigger is generated in response to the second trigger. The fourth trigger has a delay relative to the second trigger of a configurable number of cycles of a third counter. Accordingly, the delay of the fourth trigger is based on the cycles of the third counter. The fourth trigger may be a trigger generated by the control logic 306 or the like and the counter may be part of that control logic. The fourth trigger may be generated using the circuits described above, have a delay from the second trigger, be a gated version of the second trigger or the like as described above.

In 718, the RF power signal 122 is generated in response to the fourth trigger. As described above, the RF power source 106 may be configured to generate an RF signal pulse having a particular delay, pulse width, and amplitude.

In 720, the RF signal 120 is generated in response to the RF power signal 122. As described above, the RF power signal 120 pulse may be generated and supplied to the RF source 108 to generate a pulse in the RF signal 120.

In 722, the particle beam 114 is accelerated in response to the RF signal 120.

In some embodiments, the fourth trigger may be used to generate a control pulse. In generating the control pulse, the fourth trigger may be used as the control pulse or used to establish a delay. The control pulse may be a pulse with the appropriate delay and pulse width relative to the first trigger. In some embodiments, a second configurable number of cycles of the third counter is used to generate the control pulse. The second configurable number of cycles of the third counter may define the pulse width. Thus, both the delay and the pulse width may be defined by the cycles of a counter.

The operations in 710 and 716 are illustrated in parallel as the generation of the triggers and the subsequent operations in 712, 714, 718, and 720 may be performed in parallel. In particular, the operations may be performed such that the generation of the particle beam in 714 and the generation of the RF signal in 720 may be performed in parallel. The generations of the RF signal and the particle beam are generated from separate third and fourth triggers. The configurable number of cycles of the second counter and the configurable number of cycles of the third counter may be different. As a result, the timing of the third trigger and the fourth trigger may be different.

Referring to FIG. 7B, in some embodiments the operation may be similar to that of FIG. 7A. However, in some embodiments, some operations are performed between receiving the first trigger in 700 and generating the second trigger in response to the first trigger in 702. For example, in 702, an interrupt service routine is performed. The interrupt service routine may be performed by the control logic 112, 302, or the like.

In some embodiments, part of the interrupt service routine may be to determine if the first trigger was a valid trigger. For example, in 704, the first trigger may be analyzed by the interrupt service routine to determine if it is valid, such as by measuring a pulse width, determining if the first trigger has maintained an active state for a threshold period of time, or the like. If the trigger is not valid, in 706, the trigger may be disregarded. The subsequent generation of the second trigger in 708 may not occur.

However, if the first trigger is valid in 704, the second trigger may be generated in 708. In particular as the second trigger is generated based on a configurable number of cycles of a counter, the delay of the second trigger can be isolated uncertainty in the processing of the interrupt service routine. Thus, the delay of the second trigger is greater than and otherwise independent of the time of the end of the execution of the interrupt service routine.

Figure 8A:
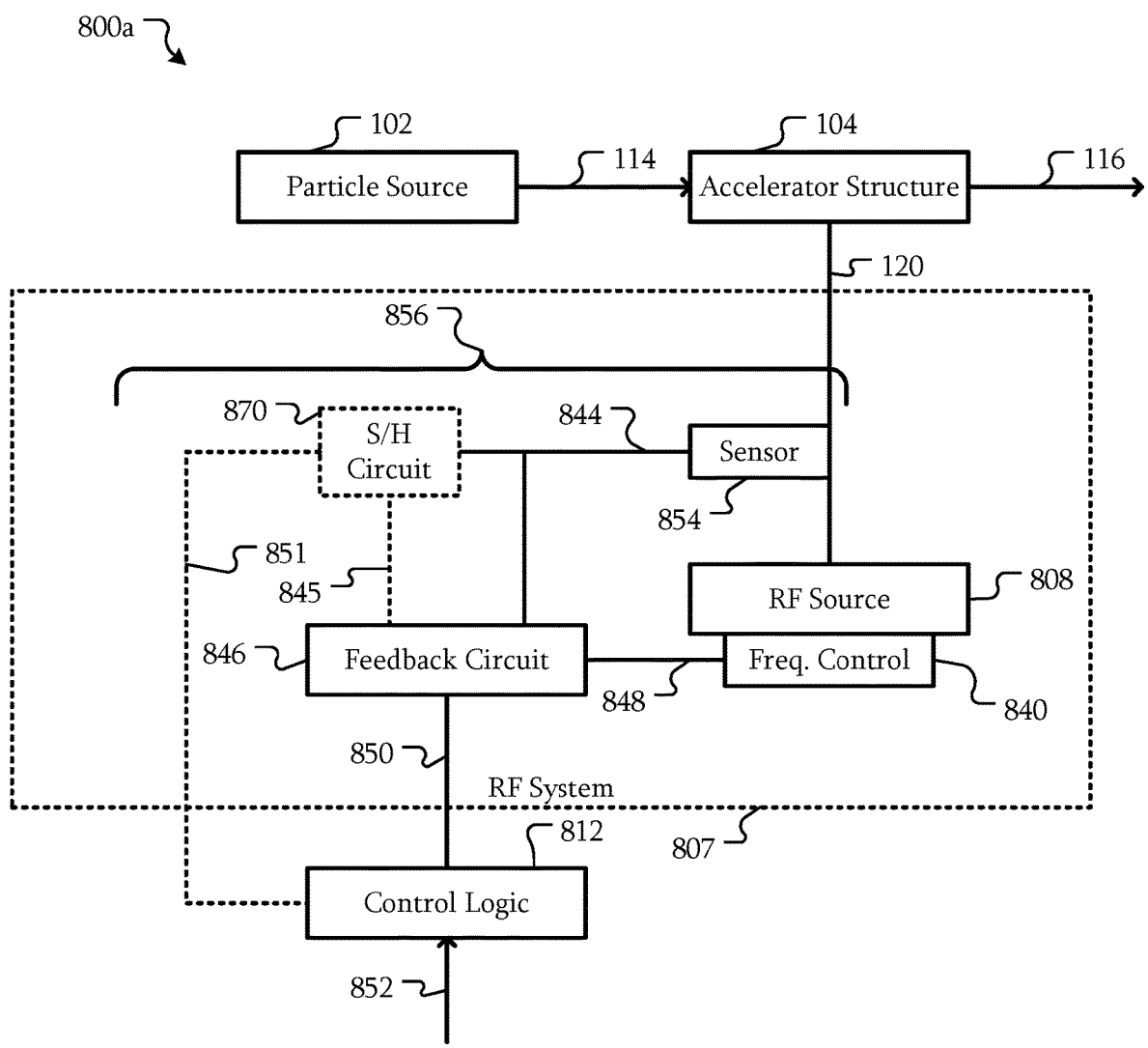
FIGS. 8A and 8B are block diagrams of frequency control systems in a configurable linear accelerator according to some embodiments.
Figure 8B:
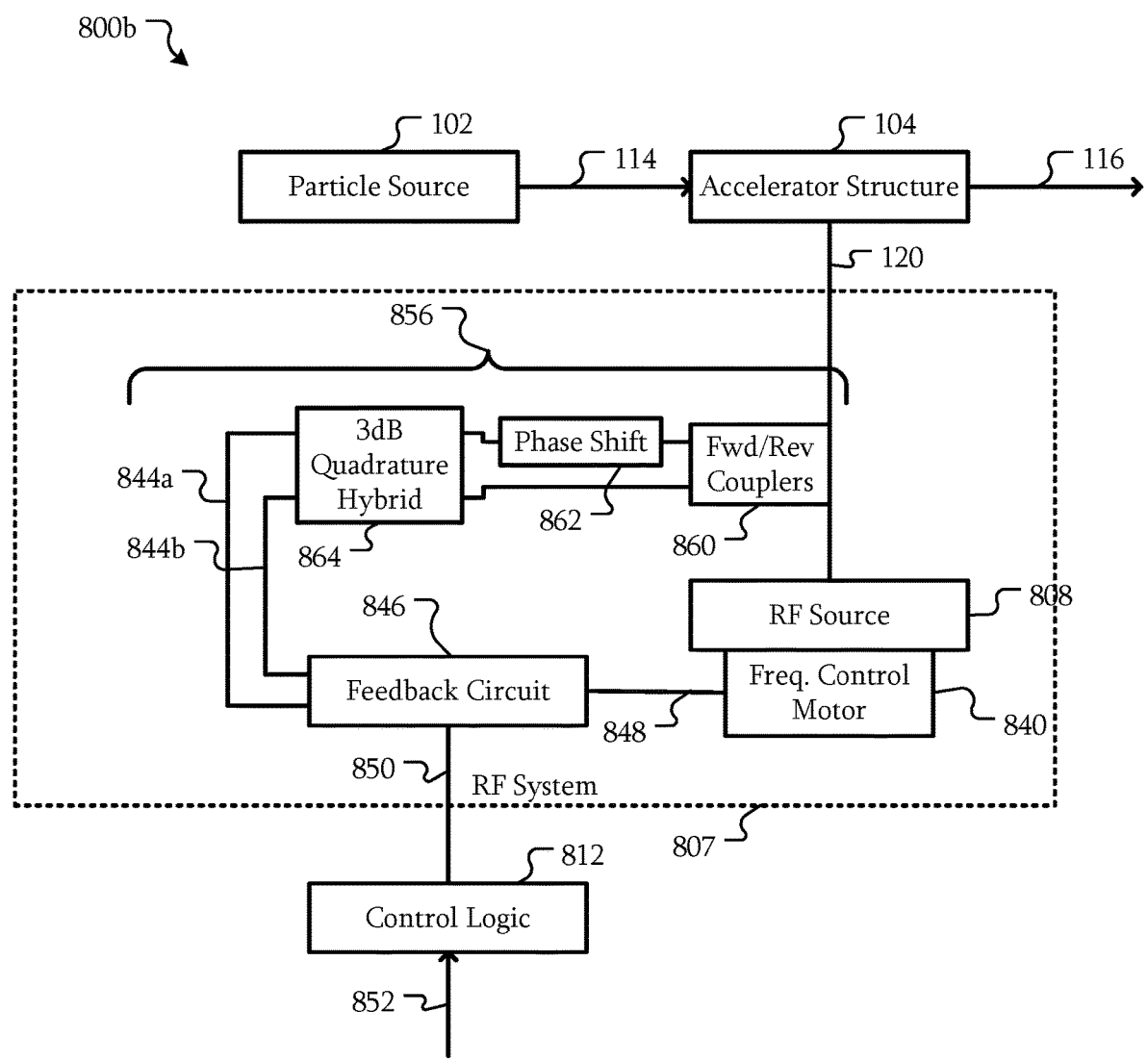

In some embodiments, the operations of FIGS. 6A and 7A or the like may be combined. For example, the pulse message received in 600 may be associated with the trigger received in the 700. Part of configuring the particle power source in 604 may include determining the configurable number of cycles of the second counter in response to the pulse message. Part of configuring the RF power source in 602 may include determining the configurable number of cycles of the third counter in response to the pulse message FIGS. 8A and 8B are block diagrams of frequency control systems in a configurable linear accelerator according to some embodiments. As described above, the amplitude of the RF signal may be changed from pulse to pulse and changed in a potentially arbitrary or random pattern. In addition, with RF sources, such as a magnetron, the tuning mechanism may not be able to be tuned on a pulse by pulse basis at pulse rates from 100 to 1000 or more pulses per second. As a result, due to the changing or potentially changing amplitude of the RF power signal a single setpoint for a frequency control system for the RF source may be appropriate for a first sequence of amplitudes of the RF signal, may not be appropriate for a second sequence of amplitudes of the RF signal.

Referring to FIG. 8A, the system 800a includes a particle source 102 and accelerator structure 104 similar to systems such as system 100a, 100b, 100c, or the like described above. The system 800a may also have similar components such as the particle power source 106 and RF power source 110, but those components are not illustrated to focus on the frequency control system of system 800a. The system 800a includes an RF source 808 that may be similar to the RF source 108 described above. In addition, the system 800a includes an RF system 807 including the RF source 808 and a RF frequency control circuit 856 including a sensor 854, a feedback circuit 846, and a frequency controller 840 for the RF source 808.

In some embodiments, the frequency controller 840 is configured to adjust a frequency of the RF source 808. For example, the RF source 808 may be a magnetron and the frequency controller 840 may include a tuning motor and a tuning slug coupled to the magnetron. In another example, the RF source 808 may be an electrically tunable source, such as a RF driver that provides the RF signal to a klystron and the frequency controller 840 may include the electrical tuning circuitry for the RF driver. However, in other embodiments, the RF source 808 may have a different form and may have a different frequency controller 840.

The RF source is configured to generate the RF signal 120. A sensor 854 is configured to sense portions of the RF signal 120 to generate a feedback signal 844. The sensor 854 may take a variety of forms. For example, the sensor 854 may include directional couplers, 3 decibel (dB) hybrid couplers, phase shifters, detectors, filters, or the like. Any circuit that can provide a feedback signal 844 that is indicative of a match between a frequency of the RF signal and the resonant frequency of the accelerator structure 104 may be used as the sensor 854. In some embodiments, the feedback signal 844 includes one or more signals representative of a phase shift between a forward and a reflected signal of the RF signal or signals 120 as sensed by the sensor 854. For example, when the output frequency of the RF source 808 is matched to the resonant frequency of the accelerator structure 104, the phase relationship between the forward and reflected RF signals may have a particular value. As the RF source 808 becomes misaligned with the accelerator structure 104, the phase relationship changes. Feedback signal 844 may represent this phase shift and may be used to realign the RF signal 120.

A feedback circuit 846 is configured to receive the feedback signal 844 and a setpoint signal 850. The feedback circuit 846 includes any circuit that can combine the feedback signal 844 and the setpoint signal 850 into an error signal 848. For example, the feedback circuit 846 may include a general-purpose processor, a digital signal processor (DSP), an application specific integrated circuit (ASIC), a microcontroller, a field programmable gate array (FPGA), a programmable logic array (PLA), a programmable logic device, discrete circuits, a combination of such devices, or the like. The feedback circuit 846 may be configured to implement a variety of control loops, such as a proportional-integral-derivative (PID) control loop. The sensor 854, feedback circuit 846, and the frequency controller 840 form an RF frequency control circuit 856 configured to adjust the frequency of the RF source 808. The setpoint signal 850 provides a way to adjust the setpoint of the RF frequency control circuit 856.

The system 800a also includes control logic 812. The control logic 812 may be similar to or part of the control logic 112, 302, 304, 306, or the like described above. However, the control logic 812 is configured to adjust a setpoint signal 850 of the RF frequency control circuit 856. In particular, the control logic 812 is configured to receive multiple settings for the RF source 808 over time. As described above, the settings for the RF source 808 may be changed from pulse to pulse. These settings may be received in messages 852 received by the control logic 812. The control logic 812 is configured to adjust the RF signal 120 in response to the settings, such as by adjusting an energy of the RF signal 120. In addition, the control logic 812 is configured to adjust the setpoint signal 850 of the RF frequency control circuit 856 in response to the settings, such as by adjusting the setpoint signal 850 supplied to the feedback circuit 846.

The accelerator structure 104 may include a series of resonant cavities that use a standing wave of RF energy to accelerate a particle beam injected into the cavities by a particle source. The RF signal 120 produced by the RF source 808 should be at the resonant frequency of the cavities in the accelerator structure 104 for the standing wave to be set up so that the particle beam 114 can be accelerated down the series of cavities. The RF source 808 has the frequency controller 840, such as a mechanical tuning slug that is physically turned in and out to adjust the output frequency of the RF signal 120. The frequency controller 840 is used to tune the frequency of the RF signal 120 to match that of the accelerator structure 104.

In some embodiments, a large amount of power is produced by the RF source 808 and coupled into the accelerator structure 104. The efficiency of both of those components may be relatively low, causing a large amount of heat to be absorbed by both the RF source 808 and accelerator structure 104. This heat causes physical dimensions of the RF source 808 and accelerator structure 104 to change size, affecting both the output frequency of the RF signal 120 and the resonant frequency of the accelerator structure 104. Due to this effect, the RF frequency control circuit 856 is used to adjust the output frequency of the RF source 808 to make sure it is matched to the resonant frequency of the accelerator structure 104.

If the RF source 808 was being operated at a single energy level or a known repeating variation in energy levels, the RF frequency control circuit 856 may be set to a single setpoint that creates an optimum match between the frequency of the RF signal 120 and the resonant frequency of the accelerator structure 104 for that fixed operating condition. However, as described above, the energy level of the RF signal 120 may be arbitrary. The energy may change from pulse to pulse in a manner that may be determined solely by a user's discretion and the total range of operation.

The control logic 812 is configured to use the settings for the RF source 808 over time to accommodate the changes in the settings. As described above, the messages 200 may be received that indicate an energy of the RF source 808. The indication may be communicated in a variety of ways such as by index into a table, absolute value, relative value, or the like. Regardless, information regarding the energy is present in the messages 200 received by the control logic 812.

Although the settings referred to above have been in the context of a message 200 received by control logic similar to the control logic 112 described above, the source of the settings received by the control logic 812 may be different. For example, as described above with respect to FIGS. 3A and 3B, information from a message 200 may be distributed to the various systems, including the RF system 307. Thus, the settings may be such specific information that was transmitted to the RF system 307 and/or another system specific to the frequency control of the RF source 808.

The control logic 812 is configured to use these settings to adjust the setpoint signal 850. A single setting is not used on a one-to-one basis to set the setpoint signal 850. Rather, multiple settings are used to determine the setpoint signal 850. In some embodiments, the control logic 812 is configured to maintain a history of the settings including a number of most recent settings of the settings for the RF source 808. For example, the control logic 812 may maintain a list of the most recent 20 settings for the RF source 808.

In response to these settings, the control logic 812 is configured to adjust the setpoint 850 of the RF frequency control circuit 856. The control logic 812 may use a variety of techniques to adjust the setpoint 850. In some embodiments, the control logic 812 is configured to implement a majority detection algorithm. The control logic 812 may analyze the history of settings to determine if one particular setting has the greatest number of settings in the history. For example, the number of settings for each mode of operation may be determined. In another example, the settings may be categorized into energy level categories. In particular, settings that may be identified as different modes may have the same energy level for the RF source 808 while having different settings for the particle source 102. These may be categorized into the same energy level category. Similarly, settings with the same energy level but different pulse widths may be categorized into different energy level categories. Any categorization of the settings into different categories may be performed.

From the categorized settings, the control logic 812 may be configured to select a category of the energy level categories having the greatest number of settings. That is, one category may have a majority or a plurality of the settings among the categories. That category may be used to determine the setpoint signal 850 for the RF frequency control circuit 856. In a particular example, the energy associated with the selected category may be used to determine the setpoint signal 850. That setpoint signal 850 is then applied to the RF frequency control circuit 856.

The control logic 812 may include calibration values for a variety of different combinations of energy levels and/or pulse widths. These calibration values may represent open loop settings for the feedback signal 844 when the frequency of the RF signal 120 is optimized for a particular mode including a combination of an energy level, pulse width, or the like. In some embodiments, calibration values may be generated for each potential mode of operation of the system 800a, including modes that are different only by parameters associated with the particle source 102. In other embodiments, calibration values may be generated that are specific to parameters of the RF source 808. In other embodiments, calibration values may be generated for different energy levels without regard to other parameters such as pulse width or delay.

In a particular example, when the RF signal 120 may have two different energy levels, the settings in the history may be analyzed to determine which energy setting is present in the majority of the settings. Using the depth of 20 settings as an example, if 11 or more of the settings are high energy settings, that energy level may be used to determine the setpoint signal 850 for the RF frequency control circuit 856. In some embodiments, if the number of settings of two different energy levels are the same, the highest energy level may be selected to determine the setpoint signal 850. Thus, if the next setting added to the history is a low energy setting and the oldest energy level is a high energy setting, the ratio of high energy to low energy would be 10:10. As a result, the high energy setting would be selected. If the next setting after the 10:10 ratio is another low energy setting and another high energy setting is removed, the ratio of high to low energy would be 9:11. As a result, the low energy setting would be selected.

Although a majority or plurality voting technique has been described as a way to determine an energy level to select a setpoint signal 850, the setpoint signal 850 may be determined in other ways. For example, the energy levels of the settings in the history may be combined together to generate a composite energy level. That composite energy level may be used to select the setpoint signal 850, such as by selecting an energy level associated with a calibrated setpoint signal 850 that is closest to the composite energy level, interpolating between two calibrated setpoint signals 850 using two energy levels closets to the composite energy level, or the like.

In other embodiments the energy levels may be combined with weights that increase versus energy level. Thus, the selected setpoint signal 850 may be weighted towards higher energy levels that may have a greater chance of affecting the alignment of the frequency of the RF signal 120 and resonant frequency of the accelerator structure 104.

In some embodiments, the depth of the history may be selected to be long enough to provide some filtering of the changes in energy but also short enough to meet a desired level of responsivity. For example, with a pulse repetition rate of 100 pulses per second, a history depth of 20 pulses may be used. Thus, the settings in the history will be the settings of pulses over the past 0.2 seconds. In another example, the history may be set to have a length that is sufficient to store one or more full cycles a repeating sequence of settings. The history may also be small enough so that a decision may be made with a full history in a shorter amount of time.

In some embodiments, the history may be implemented as a rolling window of the most recent settings. For example, the history may operate as a first-in first-out buffer with each new setting for a current or upcoming pulse being newly added to the history while the oldest setting is removed from the history.

In some embodiments, once a particular mode is selected out of the previous history of settings, the calibration information associated with that mode may be used to set the setpoint 850. For example, a mode index may be used to look up the calibration values for that mode. The control logic 812 then sets the setpoint 850 to that particular calibrated value.

Although examples of selecting a setpoint signal 850 based on finding a closest match to a single calibrated mode, in other embodiments, calibrations may be created for patterns of modes. For example, a predicted changing pattern of modes may be applied to the system 800*a*, the frequency of the RF signal 120 may be tuned to an optimum setting while that pattern is being repeated. Multiple calibration values may be generated for multiple different patterns. As will be described in further detail below, in some embodiments, the sampling of the feedback signal 844 may be performed. If a pattern of modes is detected, a mode having a higher or the highest energy may be used as the mode during which the RF frequency control circuit is operated.

In some embodiments, the system 800*a* includes a sample and hold (S/H) circuit 870. The S/H circuit 870 is configured to sample the feedback signal 844 to generate the sampled feedback signal 845 in response to control signal 851. The feedback circuit 846 is configured to use the sampled feedback signal 845. As described above, the RF signal 120 may be pulsed. The feedback signal 844 may be valid only during a pulse of the RF signal 120. The control logic 812 may be configured to generate the control signal 851 to activate the S/H circuit 870 during the pulse. In some embodiments, the control logic 812 may be configured to generate the control signal 851 with a pulse width that matches the pulse width of the control signal 126 (illustrated in FIG. 1A). However, in other embodiments the pulse width may be different. In some embodiments, the pulse width of the control signal 851 pulse may be fixed regardless of mode. However, the delay of the pulse of the control signal 851 may still be changed based on the mode.

In addition, the control logic 812 may be configured to change timing of the control signal 851 in response to an indication of the pulse timing for a pulse of the RF signal 120. As described above, the delay of the pulse timing may change from pulse to pulse. The delay of the control signal 851 may be changed accordingly. As a result, the sampling of the feedback signal 844 may accommodate changes in the delay of the RF signal 120.

Moreover, as described above, the control logic 812 may select a particular mode based on multiple settings over time to set the setpoint 850. In some embodiments, the control logic 812 may select one of the modes as the mode during which the frequency control circuit 856 is activated. The control signal 851 may be activated only during the pulses of that one of the modes. Thus, while the RF signal 120 may be pulsed, the control signal 851 may not be pulsed for each of those pulses of the RF signal 120. As a result, the RF frequency control circuit 856 may be activated only for the pulses associated with a particular mode.

Using the example of 20 settings in the history and two modes, when the higher energy mode to lower energy mode is 11:9, the control signal 851 may be activated only when the higher energy mode is pulsed. The activation of the control signal 851 will be activated whenever the higher energy mode is pulsed as long as the higher energy mode is the majority in the history. However, once the ratio changes to 9:11, the control signal 851 will be activated only when the lower energy mode is pulsed.

Although a S/H circuit 870 has been used as an example, in other embodiments, the sampling may be performed in other ways. For example, the feedback signal 844 may be continuously sampled in the feedback circuit 846. The feedback circuit 846 may use only a portion of the digitized feedback signal 844 corresponding to the desired pulse of the RF signal 120.

In some embodiments, the control logic 812 may be configured to store a default setting. After a series of pulses, the state of the RF frequency control circuit 856 may be in a state dependent on the last mode or the last mode that was sampled to adjust the frequency of the RF source 808. In some embodiments, the control logic 812 may be configured to set the state of the setpoint 850 and the state of the error signal 848 such that the state of the frequency control 840 of the RF source 808 is in a known state. As a result, the repeatability of a series of pulses may be increased. In some embodiments, after a series of pulses, the history of settings may be reset to all be the default setting.

Referring to FIG. 8B, the system 800*b* may be similar to the system 800*a* described above. However, in some embodiments, a specific type of sensor 854 or feedback path may be used. Here, forward and reverse couplers 860 are coupled between the RF source 808 and the accelerator structure 104. The forward and reverse couplers 860 are configured to provide signals indicative of the supplied RF signal 120 and a signal reflected from the accelerator structure 104. The forward and reverse couplers 860 may be implemented by a four-port directional coupler, multiple couplers, or the like. Regardless, a forward and reverse signal are generated, one of which may be shifted in phase by the phase shifter 862. The two resulting signals are input to a 3 dB quadrature hybrid coupler 864.

The output signals 844*a* and 844*b* from 3 dB hybrid coupler 864 are input into the feedback circuit 846. The feedback circuit 846 may include analog to digital converters to digitize the output signals 844*a* and 844*b*. In some embodiments, the digitized output signals 844*a* and 844*b* may be used as the feedback signal 844; however, in other embodiments, the digitized output signals 844*a* and 844*b* may be combined, such as by being subtracted, to generate a single feedback signal 844. The amplitudes of these signals or the combined signal change as the RF signal 120 drift from resonance.

Although not illustrated other components may be present in the system 800*b*. For example, the output signals 844*a* and 844*b* from 3 dB hybrid coupler 864 may be filtered to remove higher frequency components. In addition, various amplifiers in the feedback path may be present.

Although a specific example of a technique of generating the feedback signal 844 or feedback signals 844*a* and 844*b* have been described with respect to FIG. 8B, in other embodiments, different techniques may be used as described with respect to FIG. 8A.

Figure 9:
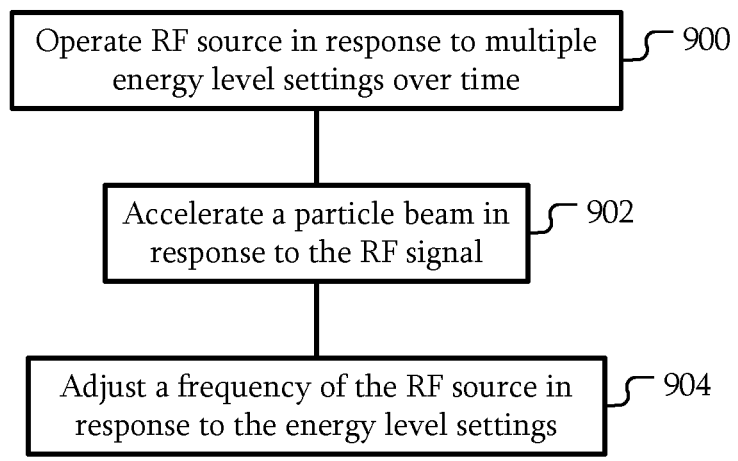
FIG. 9 is a flowchart illustrating techniques of adjusting a frequency of an RF source of a configurable linear accelerator according to some embodiments.

FIG. 9 is a flowchart illustrating techniques of adjusting a frequency of an RF source of a configurable linear accelerator according to some embodiments. The system 800*a* of FIG. 8A will be used as an example; however, in other embodiments, the techniques may be used in other systems.

In 900, an RF source is operated to generate an RF signal in response to a plurality of energy level settings over time. As described above, the RF source 808 may be operated at multiple settings that may have multiple energy levels. As a result, the RF signal 120 may have multiple energy levels over time.

In 902, a particle beam is accelerated in response to the RF signal. For example, a particle beam 114 generated by the particle source 102 may be accelerated in the accelerator structure 104 in response to an RF signal 120 from an RF source 808.

In 904, a frequency of the RF source is adjusted in response to the energy level settings. For example, the RF frequency control circuit 856 may be used to control a frequency of the RF signal 120. The control logic 812 may adjust the setpoint 850 in response to the various settings as described above.

As part of adjusting the frequency of the RF source, an indication of a pulse timing for an upcoming RF pulse may be received. For example, as described above a message 200 may be received including the indication of the pulse timing for the RF signal 120. Accordingly, the timing of the RF pulse may be changed for the upcoming pulse. The timing of sampling of feedback RF signals in the frequency control circuit 856 for the RF source 808 is changed based on the indication of the pulse timing.

As part of adjusting the frequency of the RF source, a history of the energy level settings including a number of most recent energy level settings may be maintained. For example, as described above, the control logic 812 may maintain a history of settings. The frequency of the RF source may be adjusted in response to the history.

As part of adjusting the frequency of the RF source 808, the energy level settings in the history may be categorized according to energy level. Once categorized, a category of the energy level settings having the greatest number of the most recent energy level settings may be selected and the frequency of the RF source 808 may be adjusted in response to the selected category. For example, the control logic 812 may maintain the categories, place new settings into the categories, remove old settings from the categories, or the like. From the categories, the control logic may select one with the greatest number and select a setpoint 850 in response.

As part of adjusting the frequency of the RF source, energy level settings in the history may be combined into a combined energy level. Alternatively or in addition, energy level settings in the history may be combined into a combined energy level using weights that increase versus energy level. The frequency of the RF source may be adjusted in response to the combined energy level. For example, the control logic 812 may combine the energy level settings into a combined energy level. That combined energy level may be used by the control logic 812 to select a setting for the setpoint 850.

Although operations of a configurable linear accelerator system have been described above in the context of particular components, in other embodiments, the operations may be performed by different components.

Figure 10:
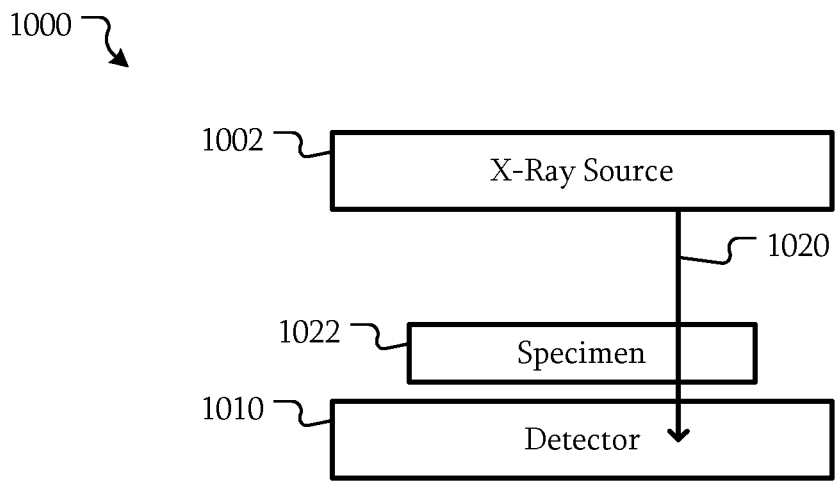
FIG. 10 is a block diagram of a 2D x-ray imaging system according to some embodiments.

FIG. 10 is a block diagram of a 2D x-ray imaging system according to some embodiments. The imaging system 1000 includes an x-ray source 1002 and a detector 1010. The x-ray source 1002 may include a configurable linear accelerator as described above. The x-ray source 1002 is disposed relative to the detector 1010 such that x-rays 1020 may be generated to pass through a specimen 1022 and detected by the detector 1010. In a particular example, the 2D x-ray imaging system may include a vehicle scanning system as part of a cargo scanning system.

Referring to FIGS. 1-9, some embodiments include a system, comprising: a particle power source 106 configured to generate a particle power signal 118; a radio frequency (RF) power source configured to generate an RF power signal 120; a particle source 102 configured to generate a particle beam 114 in response to the particle power signal 118; a RF source 108, 808 configured to generate an RF signal in response to the RF power signal 120; and an accelerator structure 104 configured to accelerate the particle beam 114 in response to the RF signal; wherein a timing of the RF power signal 120 is different from a timing of the particle power signal 118.

In some embodiments, the RF power source 110 is configured to generate the RF power signal 120 having a voltage independent of the particle power signal 118.

In some embodiments, the RF power source 110 is configured to generate the RF power signal 120 having a timing independent of the particle power signal 118.

In some embodiments, a pulse width of the RF power signal 120 is different from a pulse width of the particle power signal 118.

In some embodiments, a pulse delay of the RF power signal 120 is different from a pulse delay of the particle power signal 118.

In some embodiments, the particle power source 106 comprises a first high-voltage source 162b configured to generate a first high-voltage in response to a main power source and is configured to generate the particle power signal 118 in response to the first high-voltage; and the RF power source 110 comprises a second high-voltage source 162a configured to generate a second high-voltage in response to the main power source and is configured to generate the RF power signal 120 in response to the second high-voltage.

In some embodiments, the system further comprises control logic 112, 302, 304, 306, 812 coupled to the particle power source 106 and the RF power source 110, wherein the control logic 112, 302, 304, 306, 812 is configured to: receive a pulse message; receive a trigger; activate the particle power source 106 in response to the pulse message and the trigger; and activate the RF power source 110 in response to the pulse message and the trigger.

In some embodiments, the system further comprises control logic 112, 302, 304, 306, 812 coupled to the particle power source 106 and the RF power source 110, wherein the control logic 112, 302, 304, 306, 812 is configured to: receive a plurality of pulse messages; receive a plurality of triggers, each trigger associated with a corresponding one of the pulse messages; and for each trigger: activate the particle power source 106 in response to the trigger and the corresponding pulse message; and activate the RF power source 110 in response to the trigger and the corresponding pulse message.

In some embodiments, for a first trigger and a second trigger of the triggers: the first trigger and the second trigger are consecutive; and the pulse message corresponding to the first trigger includes an indication of a first amplitude of one of the particle power source 106 and the RF power source 110; the pulse message corresponding to the second trigger includes an indication of a second amplitude of the one of the particle power source 106 and the RF power source 110; and the first amplitude is different from the second amplitude.

In some embodiments, for a first trigger and a second trigger of the triggers: the first trigger and the second trigger are consecutive; and the pulse message corresponding to the first trigger includes an indication of a first timing of one of the particle power source 106 and the RF power source 110; the pulse message corresponding to the second trigger includes an indication of a second timing of the one of the particle power source 106 and the RF power source 110; and the first timing is different from the second timing.

In some embodiments, for a first trigger, a second trigger, and a third trigger of the triggers: the first trigger, the second trigger and the third trigger are consecutive; and the pulse message corresponding to the first trigger includes an indication of a first timing or amplitude of one of the particle power source 106 and the RF power source 110; the pulse message corresponding to the second trigger includes an indication of a second timing or amplitude of the one of the particle power source 106 and the RF power source 110; the pulse message corresponding to the third trigger includes an indication of a third timing or amplitude of the one of the particle power source 106 and the RF power source 110; and the first timing or amplitude is different from the third timing or amplitude.

Some embodiments include a system, comprising: a particle power source 106 configured to receive a first alternating current (AC) power and a first control signal and generate a particle power signal 118 from the first AC power based on the first control signal; a radio frequency (RF) power source configured to receive a second AC power a second control signal and generate an RF power signal 120 from the second AC power based on the second control signal; a particle source 102 configured to generate a particle beam 114 in response to the particle power signal 118; a RF source 108, 808 configured to generate an RF signal in response to the RF power signal 120; an accelerator structure 104 configured to accelerate the particle beam 114 in response to the RF signal; and control logic 112, 302, 304, 306, 812 configured to generate the first control signal and the second control signal.

In some embodiments, for at least one set of the first control signal and the second control signal, an amplitude of the RF power signal 120 is different from an amplitude of the particle power signal 118.

In some embodiments, for at least one set of the first control signal and the second control signal, a timing of the RF power signal 120 is different from a timing of the particle power signal 118.

Some embodiments include a method, comprising: receiving a pulse message; configuring a radio frequency (RF) power source to output an RF power signal 120 based on the pulse message; configuring a particle power source 106 to output a particle power signal 118 based on the pulse message; driving a particle source 102 with the particle power signal 118; driving an RF source 108, 808 with the RF power signal 120; and accelerating a particle beam 114 from the particle source 102 using the RF source 108, 808.

In some embodiments, the method further comprises: receiving a trigger associated with the pulse message; generating the RF power signal 120 in response to the trigger; and generating the particle power signal 118 in response to the trigger.

In some embodiments, the RF power signal 120 is referred to as a first RF power signal 120 and the particle power signal 118 is referred to as a first particle power signal 118, the method further comprising: receiving a second pulse message; reconfiguring the RF power source 110 to output a second RF power signal 120 based on the second pulse message; reconfiguring the particle power source 106 to output a second particle power signal 118 based on the second pulse message; driving the particle source 102 with the second particle power signal 118; and driving the RF source 108, 808 with the second RF power signal 120; wherein the second RF power signal 120 is different from the first RF power signal 120 or the second particle power signal 118 is different from the first particle power signal 118.

In some embodiments, a timing of the second RF power signal 120 is different from a timing of the first RF power signal 120 or a timing of the second particle power signal 118 is different from a timing of the first particle power signal 118.

In some embodiments, an amplitude of the second RF power signal 120 is different from an amplitude of the first RF power signal 120 or an amplitude of the second particle power signal 118 is different from an amplitude of the first particle power signal 118.

In some embodiments, a timing of the RF power signal 120 is different from a timing of the particle power signal 118.

Some embodiments include a system, comprising: a first control logic 112, 302, 304, 306, 812 configured to receive a first trigger and generate a second trigger in response to the first trigger, the second trigger having a delay relative to the first trigger of a configurable number of cycles of a counter of the first control logic 112, 302, 304, 306, 812; a second control logic 112, 302, 304, 306, 812 configured to receive the second trigger and generate a third trigger in response to the second trigger, the third trigger having a delay relative to the second trigger of a configurable number of cycles of a counter of the second control logic 112, 302, 304, 306, 812; a third control logic 112, 302, 304, 306, 812 configured to receive the second trigger and generate a fourth trigger in response to the second trigger, the fourth trigger having a delay relative to the second trigger of a configurable number of cycles of a counter of the third control logic 112, 302, 304, 306, 812; a particle power source 106 including the second control logic 112, 302, 304, 306, 812 and configured to generate a particle power signal 118 in response to the third trigger; a radio frequency (RF) power source including the third control logic 112, 302, 304, 306, 812 and configured to generate an RF power signal 120 in response to the fourth trigger; a particle source 102 configured to generate a particle beam 114 in response to the particle power signal 118; a RF source 108, 808 configured to generate an RF signal in response to the RF power signal 120; and an accelerator structure 104 configured to accelerate the particle beam 114 in response to the RF signal.

In some embodiments, the system further comprises: a first high-voltage power source; and a second high-voltage power source separate from the first high-voltage power source; wherein: the particle power source 106 is configured to generate the particle power signal 118 in response to the third trigger using the first high-voltage power source; and the radio frequency (RF) power source is configured to generate the RF power signal 120 in response to the fourth trigger using the second high-voltage power source.

In some embodiments, the configurable number of cycles of the counter of the second control logic 112, 302, 304, 306, 812 is different from the configurable number of cycles of the counter of the third control logic 112, 302, 304, 306, 812.

In some embodiments, the first control logic 112, 302, 304, 306, 812 is configured to perform an interrupt service routine in response to the first trigger; and the delay relative to the first trigger is independent of a time execution of the interrupt service routine ends.

In some embodiments, the first control logic 112, 302, 304, 306, 812 is configured to: receive a pulse message associated with the first trigger before the first trigger; transmit a first control message to the second control logic 112, 302, 304, 306, 812 indicating the configurable number of cycles of the counter of the second control logic 112, 302, 304, 306, 812; and transmit a second control message to the third control logic 112, 302, 304, 306, 812 indicating the configurable number of cycles of the counter of the third control logic 112, 302, 304, 306, 812.

In some embodiments, the second control logic 112, 302, 304, 306, 812 is configured to generate a control pulse in response to the third trigger; and the particle power source 106 is configured to generate the particle power signal 118 based on the control pulse.

In some embodiments, the second control logic 112, 302, 304, 306, 812 is configured to generate the control pulse based on a second configurable number of cycles of the counter of the second control logic 112, 302, 304, 306, 812.

In some embodiments, the third control logic 112, 302, 304, 306, 812 is configured to generate a control pulse in response to the fourth trigger; and the RF power source 110 is configured to generate the particle power signal 118 based on the control pulse.

In some embodiments, the third control logic 112, 302, 304, 306, 812 is configured to generate the control pulse based on a second configurable number of cycles of the counter of the third control logic 112, 302, 304, 306, 812.

Some embodiments include a method, comprising: receiving a first trigger; generating a second trigger in response to the first trigger, the second trigger having a delay relative to the first trigger of a configurable number of cycles of a first counter; generating a third trigger in response to the second trigger, the third trigger having a delay relative to the second trigger of a configurable number of cycles of a second counter; generating a fourth trigger in response to the second trigger, the fourth trigger having a delay relative to the second trigger of a configurable number of cycles of a third counter; generating a particle power signal 118 in response to the third trigger; generating a radio frequency (RF) power signal 122 in response to the fourth trigger; generating a particle beam 114 in response to the particle power signal 118; generating an RF signal in response to the RF power signal 120; and accelerating the particle beam 114 in response to the RF signal.

In some embodiments, the configurable number of cycles of the second counter is different from the configurable number of cycles of the third counter.

In some embodiments, the method further comprises: performing an interrupt service routine in response to the first trigger; wherein the delay relative to the first trigger is independent of a time execution of the interrupt service routine ends.

In some embodiments, receiving a pulse message associated with the first trigger before the first trigger; determining the configurable number of cycles of the second counter in response to the pulse message; and determining the configurable number of cycles of the third counter in response to the pulse message.

In some embodiments, the method further comprises: generating a control pulse in response to the third trigger; wherein generating the particle power signal 118 comprises generating the particle power signal 118 in response to the control pulse.

In some embodiments, generating the control pulse comprises generating the control pulse based on a second configurable number of cycles of the second counter.

In some embodiments, generating a control pulse in response to the fourth trigger; wherein generating the RF power signal 120 comprises generating the RF power signal 120 in response to the control pulse.

In some embodiments, generating the control pulse comprises generating the control pulse based on a second configurable number of cycles of the third counter.

In some embodiments, generating the particle power signal 118 in response to the third trigger comprises generating the particle power signal 118 using a first high-voltage 162b power source; and generating the RF power signal 120 in response to the fourth trigger comprises generating the RF power signal 120 using a second high-voltage power source 162a separate from the first high-voltage power source.

Some embodiments include a system, comprising: means for receiving a first trigger; means for generating a second trigger in response to the first trigger, the second trigger having a delay relative to the first trigger of a configurable number of cycles of a first counter; means for generating a third trigger in response to the second trigger, the third trigger having a delay relative to the second trigger of a configurable number of cycles of a second counter; means for generating a fourth trigger in response to the second trigger, the fourth trigger having a delay relative to the second trigger of a configurable number of cycles of a third counter; means for generating a particle power signal in response to the third trigger; means for generating a radio frequency (RF) power signal in response to the fourth trigger; means for generating a particle beam in response to the particle power signal; means for generating an RF signal in response to the RF power signal; and means for accelerating the particle beam in response to the RF signal. Examples of the means for receiving the first trigger include the control logic. Examples of the means for generating the second trigger include the control logic 112. Examples of the means for generating the third trigger include the control logic 304. Examples of the means for generating the fourth trigger include the control logic 306. Examples of the means for generating a particle power signal include the particle power source 106. Examples of the means for generating an RF power signal include the RF power source 110. Examples of the means for generating the particle beam include the particle source 102. Examples of the means for generating the RF signal include the RF source 108, 808. Examples of the means for accelerating the particle beam include the accelerator structure 104.

In some embodiments, the system further comprises: means for performing an interrupt service routine in response to the first trigger; wherein the delay relative to the first trigger is independent of a time execution of the interrupt service routine ends. Examples of the means for performing the interrupt service routine include the control logic 112, 302, 304, 306.

Some embodiments include a system, comprising: an RF source 108, 808 configured to generate an RF signal; an RF frequency control circuit coupled to the RF source 108, 808 and configured to adjust a frequency of the RF signal; an accelerator structure 104 configured to accelerate a particle beam 114 in response to the RF signal; and control logic 112, 302, 304, 306, 812 configured to: receive a plurality of settings over time for the RF source 108, 808; adjust the RF signal in response to the settings; and adjust a setpoint of the RF frequency control circuit in response to the settings.

In some embodiments, the control logic 112, 302, 304, 306, 812 is configured to: maintain a history of settings including a number of most recent settings of the settings for the RF source 108, 808; and adjust the setpoint of the RF frequency control circuit 856 in response to the history.

In some embodiments, the control logic 112, 302, 304, 306, 812 is configured to initialize the history of settings with a default setting for the RF source 108, 808.

In some embodiments, the control logic 112, 302, 304, 306, 812 is configured to: categorize the settings in the history into energy level categories; select a category of the energy level categories having the greatest number of settings; and adjust the setpoint of the RF frequency control circuit in response to an energy level associated with the selected category.

In some embodiments, the control logic 112, 302, 304, 306, 812 is configured to: combine energy levels associated with the settings in the history into a combined energy level; and adjust the setpoint of the RF frequency control circuit in response to the combined energy level.

In some embodiments, the control logic 112, 302, 304, 306, 812 is configured to: combine energy levels associated with the settings in the history into a combined energy level using weights that increase versus energy level; and adjust the setpoint of the RF frequency control circuit in response to the combined energy level.

In some embodiments, the history spans at time less than or equal to 0.2 seconds.

In some embodiments, the control logic 112, 302, 304, 306, 812 is configured to: receive an indication of an energy level for an upcoming RF pulse; and add the indication of the energy level to the history.

In some embodiments, the control logic 112, 302, 304, 306, 812 is configured to: receive an indication of a pulse timing for an upcoming RF pulse of the RF signal 120; and change timing of sampling of one or more feedback RF signals in a frequency control circuit 856 for the RF source 108, 808 based on the indication of the pulse timing.

Some embodiments include a method, comprising: operating an RF source 108, 808 to generate an RF signal in response to a plurality of energy level settings over time; accelerating a particle beam 114 in response to the RF signal; and adjusting a frequency of the RF source 108, 808 in response to the energy level settings.

In some embodiments, the method further comprises: receiving an indication of a pulse timing for an upcoming RF pulse; and changing timing of sampling of feedback RF signals in a frequency control circuit for the RF source 108, 808 based on the indication of the pulse timing.

In some embodiments, the method further comprises: maintaining a history of the energy level settings including a number of most recent energy level settings; and adjusting the frequency of the RF source 108, 808 in response to the history.

In some embodiments, the method further comprises initializing the history of the energy level settings with a default setting.

In some embodiments, the method further comprises: categorizing the energy level settings in the history according to energy level; selecting a category of the energy level settings having the greatest number of the most recent energy level settings; and adjusting the frequency of the RF source 108, 808 in response to the selected category.

In some embodiments, the method further comprises: combining energy level settings in the history into a combined energy level; and adjusting the frequency of the RF source 108, 808 in response to the combined energy level.

In some embodiments, the method further comprises: combining energy level settings in the history into a combined energy level using weights that increase versus energy level; and adjusting the frequency of the RF source 108, 808 in response to the combined energy level.

In some embodiments, maintaining the history of energy level settings comprises maintaining the history spanning a time less than or equal to 0.2 seconds.

In some embodiments, the method further comprises: receiving an indication of an energy level for an upcoming RF pulse; and adding the indication of the energy level to the history.

Some embodiments include a system, comprising: means for generating an RF signal in response to a plurality of energy level settings over time; means for accelerating a particle beam in response to the RF signal; and means for adjusting a frequency of the RF signal in response to the energy level settings. Examples of the means for generating an RF signal include the RF sources 108, 808, or the like. Examples of the means for accelerating a particle beam include the accelerator structure 104. Examples of the means for adjusting a frequency of the RF signal include the RF frequency control circuit 856 and control logic 812.

In some embodiments, the system further comprises: means for maintaining a history of settings including a number of most recent settings of the settings for the RF signal; and means for adjusting a setpoint of the means for adjusting the frequency of the RF source in response to the history. Examples of the means for adjusting the history of settings include the control logic 818. Examples of the means for adjusting a setpoint include the control logic 818.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claims 1, 2, or 3, with these separate dependencies yielding three distinct embodiments; claim 5 can depend from any one of claims 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112 ¶6. Embodiments of the invention in which an exclusive property or privilege is claimed are defined as follows.

The invention claimed is:

1. A system, comprising:
a particle power source configured to generate a particle power signal including a particle power pulse having a particle power pulse timing;
a radio frequency (RF) power source configured to generate an RF power signal including an RF power pulse having an RF power pulse timing;
a particle source configured to generate a particle beam pulse in response to the particle power pulse;
a RF source configured to generate an RF signal pulse in response to the RF power pulse;
an accelerator structure configured to accelerate the particle beam pulse in response to the RF signal pulse; and control logic coupled to the particle power source and the RF power source, wherein the control logic is configured to:
  receive a pulse message;
  activate the particle power source to generate the particle power pulse in response to the pulse message; and
  activate the RF power source to generate the RF power pulse in response to the pulse message;
  wherein the control logic is configured to activate the particle power source and the RF power source such that a difference between the particle power pulse timing and the RF power pulse timing is based on the pulse message.

2. The system of claim 1, wherein the RF power source is configured to generate the RF power signal having a voltage independent of the particle power signal.

3. The system of claim 1, wherein the RF power pulse timing is independent of the particle power pulse timing.

4. The system of claim 3, wherein a pulse width of the RF power pulse is different from a pulse width of the particle power pulse.

5. The system of claim 3, wherein a pulse delay of the RF power pulse is different from a pulse delay of the particle power pulse.

6. The system of claim 1, wherein:
  the particle power source comprises a first high-voltage source configured to generate a first high-voltage in response to a main power source and is configured to generate the particle power signal in response to the first high-voltage; and
  the RF power source comprises a second high-voltage source configured to generate a second high-voltage in response to the main power source and is configured to generate the RF power signal in response to the second high-voltage.

7. The system of claim 1, wherein the control logic is further configured to:
  receive a trigger;
  activate the particle power source to generate the particle power pulse in response to the pulse message and the trigger; and
  activate the RF power source to generate the RF power pulse in response to the pulse message and the trigger.

8. The system of claim 1, wherein:
  the pulse message is one of a plurality of pulse messages; and
  the control logic is configured to:
    receive the plurality of pulse messages;
    receive a plurality of triggers, each trigger associated with a corresponding one of the pulse messages; and
    for each trigger:
      activate the particle power source to generate a corresponding particle power pulse in response to the trigger and the corresponding pulse message; and
      activate the RF power source to generate a corresponding RF power pulse in response to the trigger and the corresponding pulse message.

9. The system of claim 8, wherein for a first trigger and a second trigger of the triggers:
  the first trigger and the second trigger are consecutive; and
  the pulse message corresponding to the first trigger includes an indication of a first amplitude of one of the corresponding particle power pulse and the corresponding RF power pulse;
  the pulse message corresponding to the second trigger includes an indication of a second amplitude of the one of the corresponding particle power pulse and the corresponding RF power pulse; and
  the first amplitude is different from the second amplitude.

10. The system of claim 8, wherein for a first trigger and a second trigger of the triggers:
  the first trigger and the second trigger are consecutive; and
  the pulse message corresponding to the first trigger includes an indication of a first timing of a corresponding pulse of one of the particle power source and the RF power source;
  the pulse message corresponding to the second trigger includes an indication of a second timing of a corresponding pulse of the one of the particle power source and the RF power source; and
  the first timing is different from the second timing.

11. The system of claim 8, wherein for a first trigger, a second trigger, and a third trigger of the triggers:
  the first trigger, the second trigger and the third trigger are consecutive; and
  the pulse message corresponding to the first trigger includes an indication of a first timing or amplitude of a corresponding pulse of one of the particle power source and the RF power source;
  the pulse message corresponding to the second trigger includes an indication of a second timing or amplitude of a corresponding pulse of the one of the particle power source and the RF power source;
  the pulse message corresponding to the third trigger includes an indication of a third timing or amplitude of a corresponding pulse of the one of the particle power source and the RF power source; and
  the first timing or amplitude is different from the third timing or amplitude.

12. A system, comprising:
  a particle power source configured to receive a first alternating current (AC) power and a first control signal and generate a particle power signal from the first AC power based on the first control signal;
  a radio frequency (RF) power source configured to receive a second AC power and a second control signal and generate an RF power signal from the second AC power based on the second control signal;
  a particle source configured to generate a particle beam in response to the particle power signal;
  a RF source configured to generate an RF signal in response to the RF power signal;
  an accelerator structure configured to accelerate the particle beam in response to the RF signal; and
  control logic configured to generate the first control signal and the second control signal based on a pulse message;
  wherein:
    the first AC power is separate from the second AC power;
    the particle power source is configured to generate the particle power signal including a particle power pulse having a particle power pulse timing;
    the RF power source is configured to generate the RF power signal including an RF power pulse having an RF power pulse timing; and
    for at least one set of the first control signal and the second control signal, a difference between the RF power pulse timing and the particle power pulse timing based on the pulse message.

13. The system of claim 12, wherein for at least one set of the first control signal and the second control signal, an amplitude of the RF power signal is different from an amplitude of the particle power signal.

14. A method, comprising:
receiving a pulse message;
configuring a radio frequency (RF) power source to output an RF power signal having an RF power pulse based on the pulse message;
configuring a particle power source to output a particle power signal having a particle power pulse based on the pulse message wherein a difference between the RF power pulse and the particle power pulse is based on the pulse message;
driving a particle source with the particle power pulse;
driving an RF source with the RF power pulse; and
accelerating a particle beam generated in response to the particle power pulse from the particle source using an RF signal generated in response to the RF power pulse from the RF source.

15. The method of claim 14, wherein a timing of the RF power pulse is different from a timing of the particle power pulse based on the pulse message.

16. The method of claim 14, further comprising:
receiving a trigger associated with the pulse message;
generating the RF power pulse in response to the trigger; and
generating the particle power pulse in response to the trigger.

17. The method of claim 14, wherein the RF power pulse is referred to as a first RF power pulse and the particle power pulse is referred to as a first particle power pulse, the method further comprising:
receiving a second pulse message;
reconfiguring the RF power source to output a second RF power pulse based on the second pulse message;
reconfiguring the particle power source to output a second particle power pulse based on the second pulse message;
driving the particle source with the second particle power pulse; and
driving the RF source with the second RF power pulse;
wherein the second RF power pulse is different from the first RF power pulse or the second particle power pulse is different from the first particle power pulse.

18. The method of claim 17, wherein a timing of the second RF power pulse is different from a timing of the first RF power pulse or a timing of the second particle power pulse is different from a timing of the first particle power pulse based on the pulse message.

19. The method of claim 17, wherein an amplitude of the second RF power pulse is different from an amplitude of the first RF power pulse or an amplitude of the second particle power pulse is different from an amplitude of the first particle power pulse based on the pulse message.

* * * * *